US006483740B2

(12) United States Patent
Spitzer et al.

(10) Patent No.: US 6,483,740 B2
(45) Date of Patent: Nov. 19, 2002

(54) ALL METAL GIANT MAGNETORESISTIVE MEMORY

(75) Inventors: Richard Spitzer, Berkeley, CA (US); E. James Torok, Shoreview, MN (US)

(73) Assignee: Integrated Magnetoelectronics Corporation, Berkeley, CA (US)

( * ) Notice: Subject to any disclaimer, the term of this patent is extended or adjusted under 35 U.S.C. 154(b) by 0 days.

(21) Appl. No.: 09/883,660

(22) Filed: Jun. 18, 2001

(65) Prior Publication Data

US 2002/0024842 A1 Feb. 28, 2002

Related U.S. Application Data

(60) Provisional application No. 60/217,338, filed on Jul. 11, 2000, and provisional application No. 60/217,781, filed on Jul. 11, 2000.

(51) Int. Cl.[7] .............................................. G11C 11/15
(52) U.S. Cl. ....................................... 365/158; 365/173
(58) Field of Search ................................ 365/173, 158, 365/157, 171

(56) References Cited

U.S. PATENT DOCUMENTS

| | | | |
|---|---|---|---|
| 3,972,786 A | 8/1976 | Ballard | 204/32 R |
| 4,751,677 A | 6/1988 | Daughton et al. | 365/158 |
| 4,829,476 A | 5/1989 | Dupuis et al. | 365/158 |
| 5,173,873 A | 12/1992 | Wu et al. | 365/173 |
| 5,565,236 A | 10/1996 | Gambino et al. | 427/130 |
| 5,585,986 A | 12/1996 | Parkin | 360/113 |
| 5,587,943 A | 12/1996 | Torok et al. | 365/158 |
| 5,640,343 A | 6/1997 | Gallagher et al. | 365/171 |
| 5,640,754 A | 6/1997 | Lazzari et al. | 29/603.14 |
| 5,650,889 A | 7/1997 | Yamamoto et al. | 360/97.01 |
| 5,650,958 A | 7/1997 | Gallagher et al. | 365/173 |
| 5,652,445 A | 7/1997 | Johnson | 257/295 |
| 5,654,566 A | 8/1997 | Johnson | 257/295 |
| 5,661,449 A | 8/1997 | Araki et al. | 338/32 |
| 5,793,697 A | 8/1998 | Scheuerlein | 365/230.07 |
| 5,852,574 A | * 12/1998 | Naji | 365/158 |
| 5,903,708 A | 5/1999 | Kano et al. | 388/32 |
| 5,969,978 A | * 10/1999 | Prinz | 365/173 |
| 6,134,138 A | * 10/2000 | Lu et al. | 365/158 |
| 6,166,944 A | * 12/2000 | Ogino | 365/97 |
| 6,278,594 B1 | 8/2001 | Engel et al. | 360/325 |
| 6,292,336 B1 | 9/2001 | Horng et al. | 360/324.12 |

OTHER PUBLICATIONS

Jacquelin K. Spong, et al., "Giant Magnetoresistive Spin Valve Bridge Sensor", Mar. 1996, IEEE Transactions on Magnetics, vol. 32, No. 2, pp. 366–371.

Mark Johnson, "The All–Metal Spin Transistor", May 1994, IEEE Spectrum, pp. 47–51.

Mark Johnson, "Bipolar Spin Switch", Apr. 16, 1996, Science, vol. 260, pp. 320–323.

J.M. Daughton, "Magnetoresistive Memory Technology," Jul. 28–Aug. 2, 1991, Int'Workshop on Science and Technology of Thin Films for the $21^{st}$ Century, vol. 216, pp. 162–168.

K.T.M. Ranmuthu et al., "New Low Current Memory Modes with Giant Magneto–Resistance Materials," Apr. 13, 1993, Digests of International Magnetics Conference, 2 pages.

J.L. Brown, "1–Mb Memory Chip Using Giant Magnetoresistive Memory Cells," Sep. 1994, IEEE Transactions on Components, Packaging, and Manufacturing Technology, Part A, vol. 17, No. 3, pp. 373–379.

Paul a. Packan, "Pushing The Limits", Sep. 24, 1999. science Mag, vol. 285, pp. 2079–2081.

Lenssen, et al, "Expectations of MRAM in Comparison With Other Non–Volatile Memory Technologies", Phillips Research Laboratories,pp. 26–30.

* cited by examiner

Primary Examiner—Tan T. Nguyen
(74) Attorney, Agent, or Firm—Beyer Weaver & Thomas, LLP.

(57) ABSTRACT

A memory device is described which includes memory cells, access lines, and support electronics for facilitating access to information stored in the memory cells via the access lines. Both the memory cells and the support electronics comprise multi-layer thin film structures exhibiting giant magnetoresistance.

82 Claims, 19 Drawing Sheets

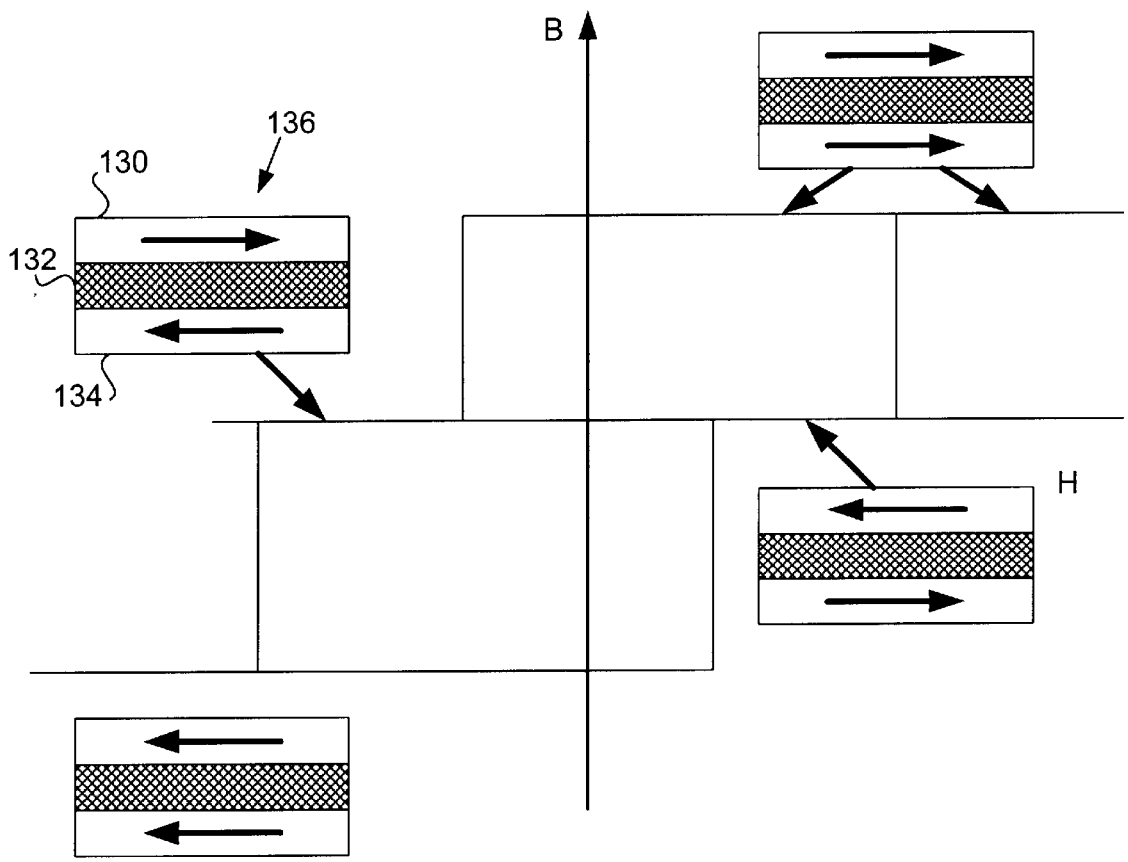
FIG. 2
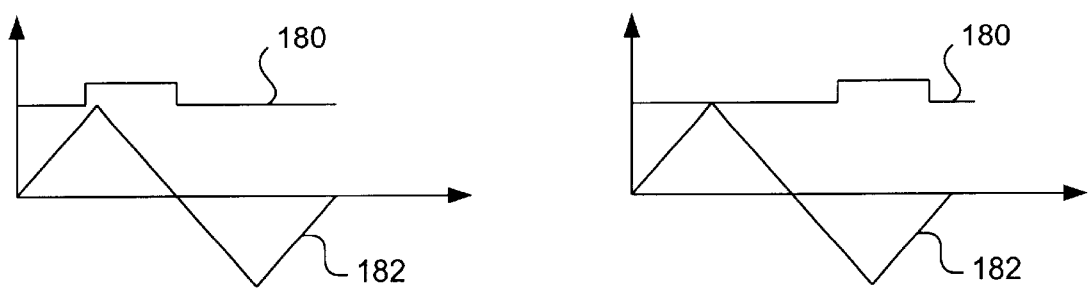
(a)　　　FIG. 3　　　(b)

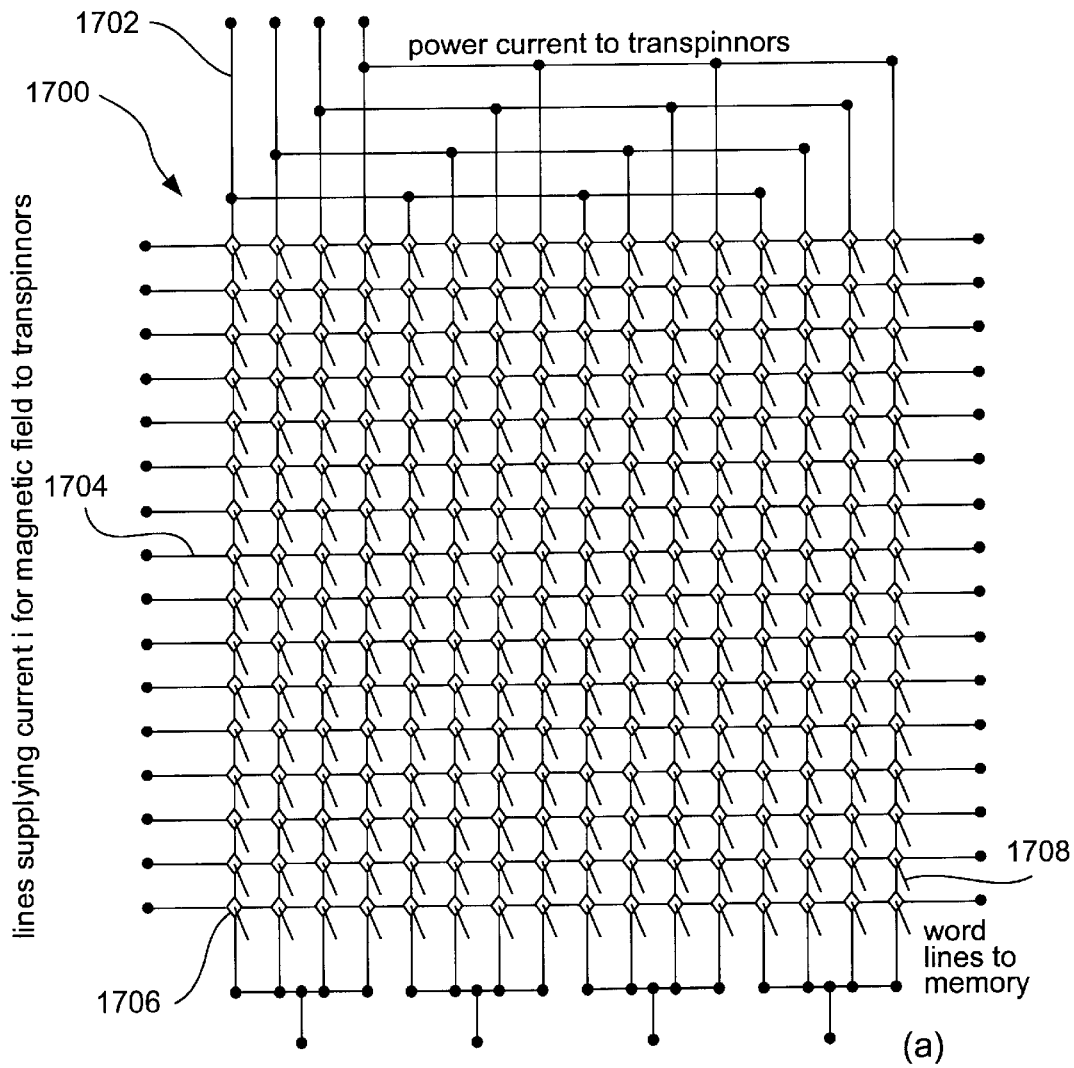
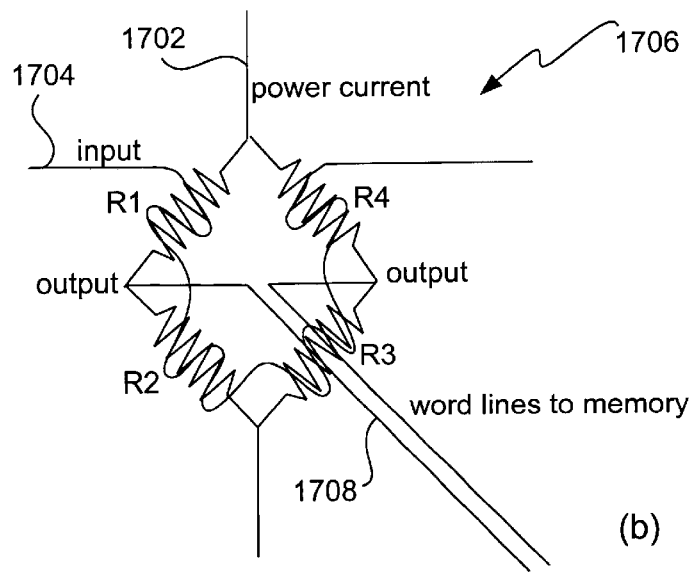
FIG. 17

ALL METAL GIANT MAGNETORESISTIVE MEMORY

RELATED APPLICATION DATA

The present application claims priority from U.S. Provisional Patent Applications No. 60/217,338 for ALL-METAL RAM and No. 60/217,781 for SOLID-STATE MASS STORAGE SYSTEM FOR IMPROVED MOBILITY AND LOW EMISSION both filed on Jul. 11, 2000, the entire disclosures of both of which are incorporated herein by reference for all purposes.

BACKGROUND OF THE INVENTION

The present invention relates to memory technology employing the property of giant magnetoresistance (GMR). More specifically, a memory architecture is described herein in which the memory cells and the control electronics are all implemented using multi-layer thin film elements exhibiting GMR. According to further embodiments, a unified memory architecture is provided in which multiple types of conventional memories are replaced by the memories of the present invention.

Semiconductor memory technology, and specifically silicon random access memories (RAMs), are an important part of the foundation of all data processing systems. The device density of silicon technology has increased steadily in the decades since its introduction and, until recently, roughly conformed to Moore's law which states that the device density of silicon chips doubles every eighteen months. That is, in recent years, the rate at which the bit density of silicon memories has improved has increasingly fallen short of the rate predicted by Moore's law. The limitations of semiconductor technology are readily apparent in the widening gap between its future potential and its past performance. There are a number of reasons for this.

First, the limitations of semiconductor technology with regard to device size have not, and in many cases cannot, keep up with advances in lithography techniques. For example, as the feature size of silicon devices shrinks, undesirable effects occur including the loss of information through charge leakage, high oxide breakdown, and power consumption problems. Inherent limitations such as the non-scalability of p-n junctions and charge pumps also translates into an inability to take full advantage of advances in lithography.

Memory systems which include mechanical elements, e.g., disk drives, are also facing technological obstacles relating to storage density such as, for example, the difficulty of mechanically aligning a read head with increasingly smaller storage locations on a magnetic storage medium. Access times for such memories are also typically orders of magnitude greater than that of the semiconductor memories which they complement. Such memories are also vulnerable to a variety of environmental stresses including, for example, shock, vibration, temperature extremes, radiation, etc. In combination, such limitations impede the dual objectives of greater information density and faster information access.

The evolution of memory technologies such as FLASH and EEPROM have addressed some of these limitations in that they have much faster access time than conventional magnetic memories and are more resistant to some environmental stresses, e.g., mechanical shock. However, these "hardcard" technologies do not have sufficient storage density or capacity to support the average stand-alone or networked computer system. Indeed, with one-tenth the capacity of standard disks, FLASH and EEPROM provide only supplemental storage capacity and have the added disadvantage of a limited number of access cycles. Moreover, although FLASH and EEPROM access times are better than those of conventional mechanical systems, they are clearly inferior as compared to DRAM or SRAM access times. In addition, the high power consumption per megabyte associated with FLASH and EEPROM necessitates larger power supplies, obviating the hardcard technologies' advantage in size and weight. Therefore, although FLASH and EEPROM provide advantages with regard to speed and reliability, these memory technologies cannot achieve the capacity or power efficiency of conventional magnetic disk drives.

More recently, there has been a significant shift in industry-wide memory development aimed at replacing both solid-state semiconductor memories and mechanical storage by magnetic RAM. Most of this activity has focused on hybrid magnetic RAMs, known generically as MRAM, in which a magnetic memory array is combined with semiconductor electronics.

It is therefore desirable to develop memory technologies which can take advantage of advances in lithography techniques without suffering from the limitations inherent in semiconductor memories, and which can take full advantage of recent developments in GMR electronics. It is also desirable to that such technologies overcome the limitations of mechanical memory systems.

SUMMARY OF THE INVENTION

According to the present invention, a memory technology is provided which is based on structures which exhibit the property of giant magnetoresistance (GMR), and which overcomes the limitations of conventional memories described above. The memory arrays of the present invention include individual memory cells comprising GMR thin film structures which store one or more bits of information in their magnetic layers. Memory access lines are configured to provide random access to each cell in an array. Selection matrices, control electronics, preamplifiers, and sense amplifiers are all implemented with an all metal device referred to herein as a "transpinnor." The transpinnor is a network of GMR thin film structures which has characteristics like both a transistor and a transformer.

The performance of GMR structures improves as the feature size decreases. In addition, production costs associated with the all metal memories described herein will be dramatically lower than those associated with semiconductor memories for a number of reasons.

First, because the GMR structures of the invention are relatively simple, the number of fabrication steps is significantly reduced as compared to the typical semiconductor process for a similar device (e.g., fewer than 10 versus greater than 30). Second, the process steps for the all metal architecture of the present invention are carried out at relatively low temperatures (e.g., 200° C.) as compared to the high temperature processing by which semiconductor techniques are characterized (e.g., 800° C.). Furthermore, hybrid magnetic RAMs involve both processing methods, with subsequent bonding of the semiconductor support electronics with the magnetic memory array. In contrast, an all-metal magnetic RAM may be fabricated as a single monolithic integrated circuit using a single mask set because the GMR electronics and the GMR memory array are made of the same materials.

In addition, implementation of the memory electronics using transpinnors is advantageous because they can be deposited and patterned at the same time as the memory elements rather than sequentially as with semiconductor process, thereby further reducing the number of process steps required. The all metal architecture of the present invention will also be more immune to radiation than semiconductor or hybrid magnetic RAM memories. Moreover, transpinnor circuits tend to take up less area than equivalent semiconductor circuits (the transpinnor-based differential sense amplifier is a good example).

Additionally and according to various specific embodiments, an all-metal magnetic RAM can be a low-power device, in part because of the inherently low power of GMR circuitry, in part because a single transpinnor can perform multiple digital functions, and in part because of the ability of GMR circuits to turn off those subsystems that are not in use.

Finally, because the memory technology of the present invention is persistent, i.e., no refresh or standby power is required to retain stored information, it may be used not only to replace RAM, but mechanical storage systems as well.

According to a specific embodiment, a unified memory architecture is provided in which each of a plurality of memory types in the architecture are implemented using a specific embodiment of the memory arrays of the present invention. A specific example of such an architecture is described in the context of a computer memory architecture in which both system memory and long term storage are implemented according to the present invention.

Thus, the present invention provides methods and apparatus relating to a memory device comprising memory cells, access lines, and support electronics for facilitating access to information stored in the memory cells via the access lines. Both the memory cells and the support electronics comprise multi-layer thin film structures exhibiting giant magnetoresistance.

The present invention also provides methods and apparatus relating to a memory architecture comprising system memory for facilitating execution of computer program instructions by a processor, and mass memory for storing information which may be accessed by the processor. The system memory and the mass memory include first and second random access memories, respectively, which include first and second arrays of memory cells, respectively. Each memory cell in the first and second arrays comprises a multi-layer thin film structure exhibiting giant magnetoresistance.

A further understanding of the nature and advantages of the present invention may be realized by reference to the remaining portions of the specification and the drawings.

BRIEF DESCRIPTION OF THE DRAWINGS

FIGS. 2 and 3 show the operation of a GMR memory cell;

FIG. 17 is a simplified schematic of a memory access line selection matrix for use with specific embodiments of memory devices designed according to the present invention;

DETAILED DESCRIPTION OF SPECIFIC EMBODIMENTS

Figure 1:
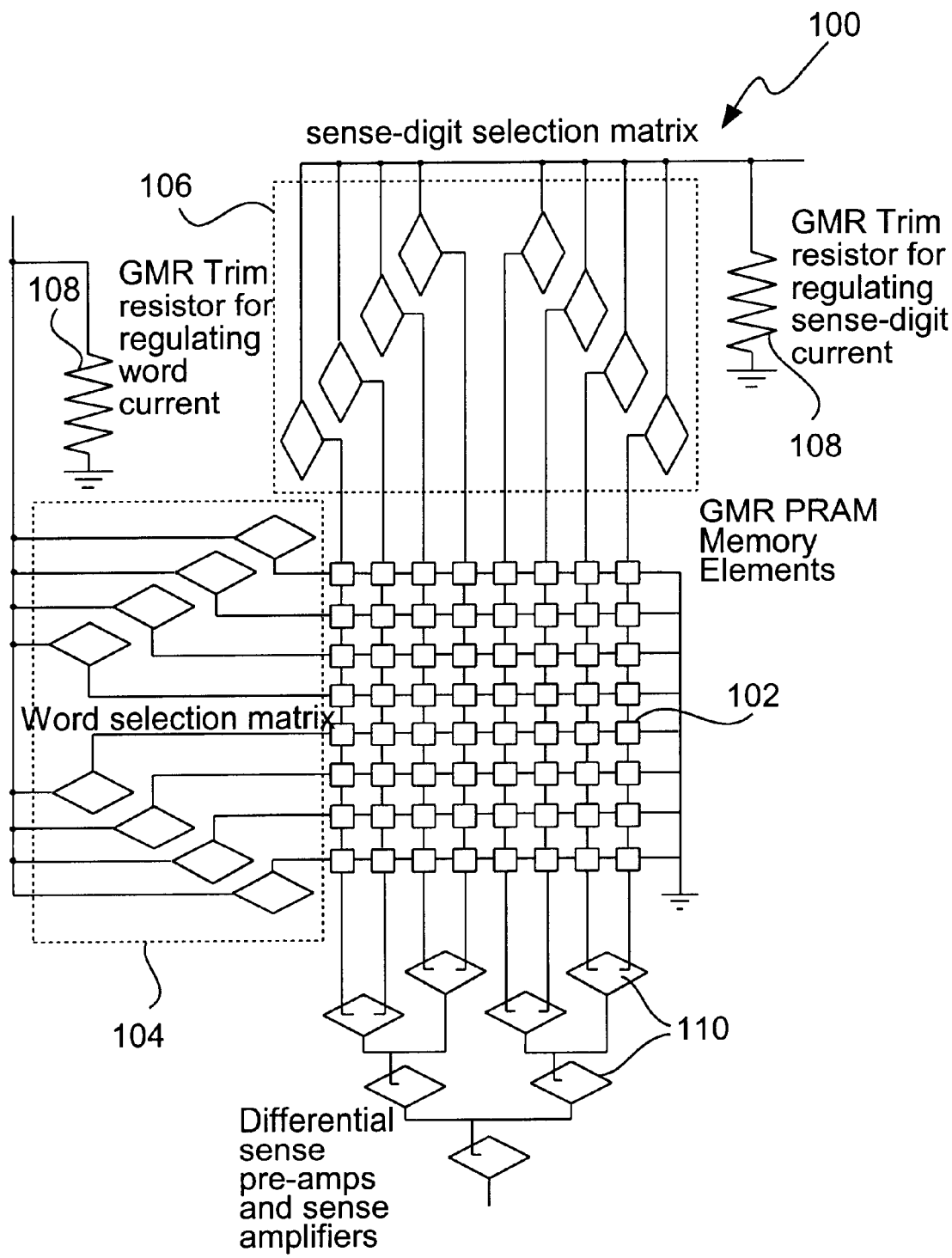
FIG. 1 is a simplified schematic of an all metal GMR memory designed according to a specific embodiment of the present invention.

FIG. 1 is a simplified diagram of an all metal random access memory 100, also referred to herein as a SpinRAM, designed according to a specific embodiment of the present invention. For the sake of clarity, only 64 storage cells 102 have been shown. It will be understood, however, that the simplified architecture of FIG. 1 may be generalized to any size memory array desired. It should also be noted that the control lines for the selection electronics have been omitted for the same purpose.

Examples of storage cells for use with the present invention are described in commonly owned U.S. Pat. No. 5,587,943 for NONVOLATILE MAGNETORESISTIVE MEMORY WITH FULLY CLOSED FLUX OPERATION issued on Dec. 24, 1996, and in commonly owned, copending U.S. patent application Ser. No. 09/883,672 for HIGH DENSITY GIANT MAGNETORESISTIVE MEMORY CELL filed contemporaneously herewith (Attorney docket number IMECP006), both of which are incorporated herein by reference in their entireties for all purposes. Specific examples of such storage cells will be described below.

FIG. 2 shows the major hysteresis loop of a GMR exchange-coupled triple-layer film which may be used as a storage element according to specific embodiments of the present invention. Two magnetic layers 130 and 134 are separated by a nonmagnetic layer 132. The two magnetic layers have coercivities that differ by more than the exchange coupling between them such that layer 130 has a high coercivity (e.g., cobalt) and layer 134 has a low coercivity (e.g., permalloy). Film cross sections 136 show the magnetization at each part of the loop.

Beginning at the upper right quadrant, both top and bottom layers 130 and 134 are saturated in the same direction. If the applied field H is reduced to substantially zero and then reversed in direction, the layer having the lower coercivity switches first, as shown by the cross section in the upper left quadrant. The switching occurs when the field is equal to the sum of the coercivity of the lower coercivity film plus the coupling field.

As the applied field H is increased in the negative direction, the film layer having a higher coercivity switches directions, as depicted in the lower left quadrant. This switching occurs when the field magnitude is equal to the coercivity of the higher-coercivity film less the value of the exchange coupling. Thus, switching is carried out in such films in a two-step process.

Readout of the memory cell of FIG. 2 is achieved in a nondestructive fashion by measuring the resistance change in response to the change in the magnetization obtained by applying a field from a word line. The application of the field switches the lower-coercivity film. FIGS. 3(a) and 3(b) depict the resistive signals 180 when a triangular word current 182 is applied. FIG. 3(a) shows the signal corresponding to a "zero" state and FIG. 3(b) shows the signal corresponding to a "one" state.

Figure 4:
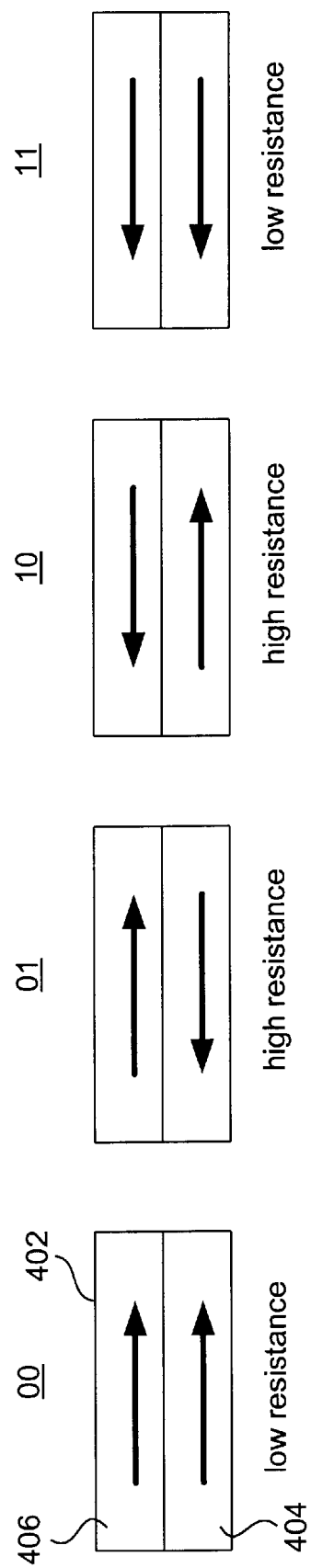
FIG. 4 shows the magnetization states of a GMR memory cell.

FIG. 4 shows four magnetization states of a memory cell 402 having a low coercivity storage layer 404 and a high coercivity storage layer 406. As indicated in the figure, each of the states represents a unique two-bit combination. That is, the state "00" is shown as both storage layers being magnetized to the right while the state "11" is shown as both layers being magnetized to the left. Because the magnetization vectors in this states are parallel, they exhibit relatively low resistance. By contrast, the states "01" and "10" are both characterized by the magnetization vectors oriented in opposite directions, i.e., a relatively high resistance state as compared to the parallel vectors due to the GMR effect.

Those of skill in the art will understand how each of the states may be written to memory cell 402. That is, layer 406 is magnetized first by the application of a magnetic field which overcomes the layer's coercivity. Because of its lower coercivity, layer 404 is also magnetized in the same direction, at least initially. The antiparallel state of layer 404 may then be written by application of a second magnetic field of the opposite orientation which is sufficient to overcome the coercivity of layer 404 but not layer 406.

Figure 5:
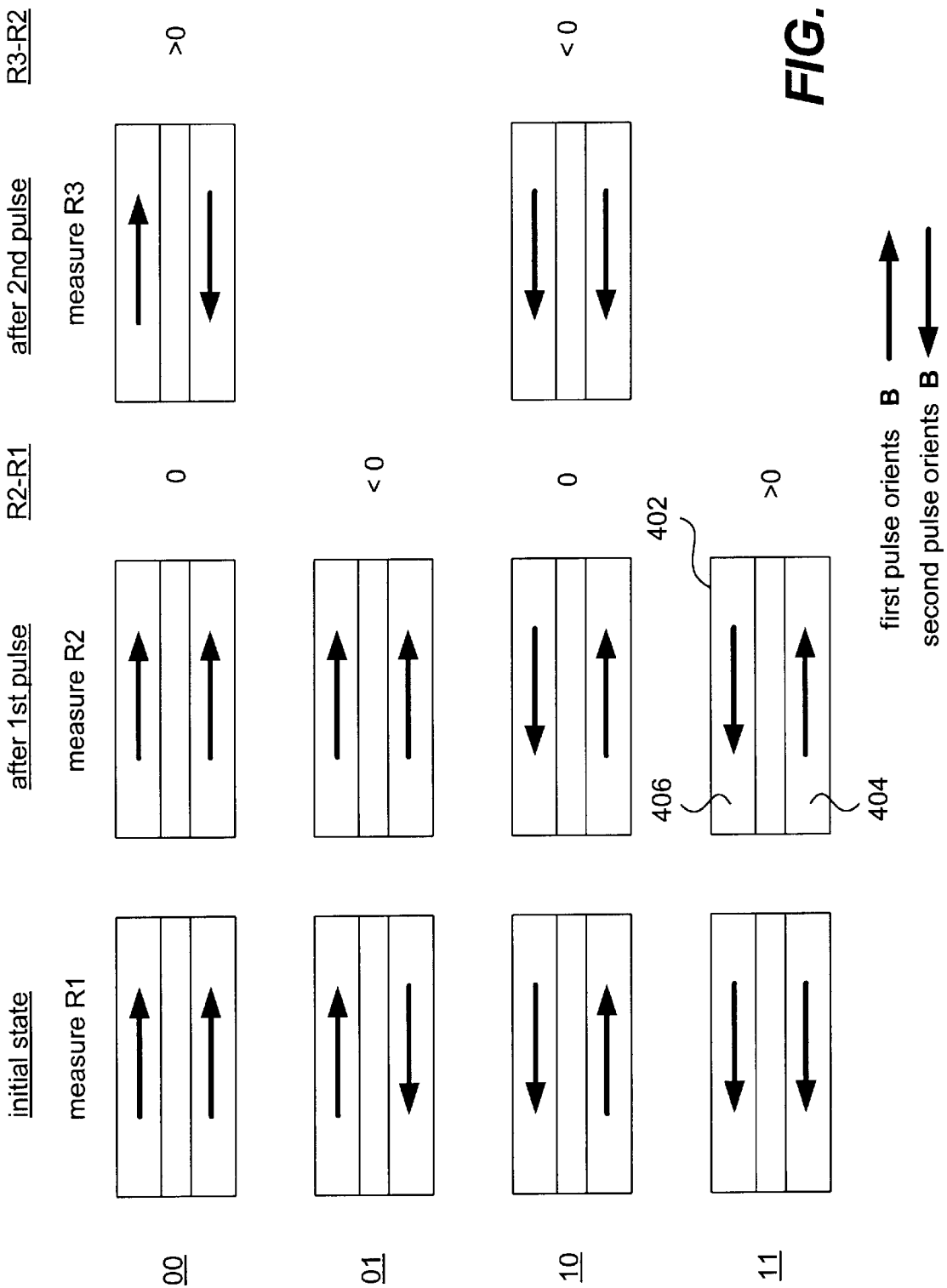
FIG. 5 illustrates operation of a GMR memory cell according to a specific embodiment of the present invention.

The reading of the information stored in memory cell 402 will now be described with reference to FIG. 5. As will be described, the read out process may vary depending upon the initial state of the cell. Initially, a resistance value $R_1$ associated with the multi-layer cell is measured while the cell is in an initial state (column 1). A magnetic field is then applied which is sufficient to overcome the coercivity of layer 404 and magnetize layer 404 in a particular direction, e.g., to the right as shown. A resistance value $R_2$ is then measured after the application of the magnetic field (column 2), and the difference between $R_1$ and $R_2$ determined (column 3). In the example shown, if $R_2-R_1$ is less than zero, then the initial state of the cell is determined to be the "01" state. Similarly, if $R_2-R_1$, is greater than zero, the initial state corresponds to the "11" state. The initial state is then rewritten to the cell.

If, on the other hand, there is no difference between $R_1$ and $R_2$, the initial state could have been either "00" or "10". If all that is desired is to determine the state of the low coercivity layer 404, i.e., "0" in both instances, no further action need be taken. However, if the state of layer 406 must be determined, a second magnetic field may be applied in the direction opposite to the first magnetic field, e.g., to the left in this example, and a third resistance value $R_3$ measured (column 4). If $R_3-R_2$ is greater than zero, the initial state is determined to be "00"; if less than 0, the initial state is determined to be "10" (column 5). The initial state is then rewritten to the cell.

Although specific embodiments of the invention (such as the one described above with reference to FIG. 5) refer to layers having different coercivities (e.g., layers 404 and 406), it should be noted that other embodiments of the invention employ layers having the same coercivities, relying on alternative mechanisms to effect storage and readout. An example of such a mechanism is the use of localized fields to switch one layer without switching a nearby layer having the same coercivity. Examples of such embodiments are described below.

According to various other embodiments of the present invention, memory cell designs are provided in which multiple bits of information may be stored in one memory cell. Specific embodiments will be described below in which 2, 3, or 4 bits of information may be stored in one memory cell and which employ either destructive read out (DRO) and nondestructive read out (NDRO). It will be understood, however, that particular ones of these designs may be generalized to store more bits of information than described.

Three embodiments which employ DRO will now be described with reference to FIGS. 6 and 7. Each of the described embodiments employs cobalt storage layers, copper access lines, and a double keeper. However, it will be understood that a variety of materials may be employed for various ones of these elements without departing from the scope of the invention.

Figure 6:
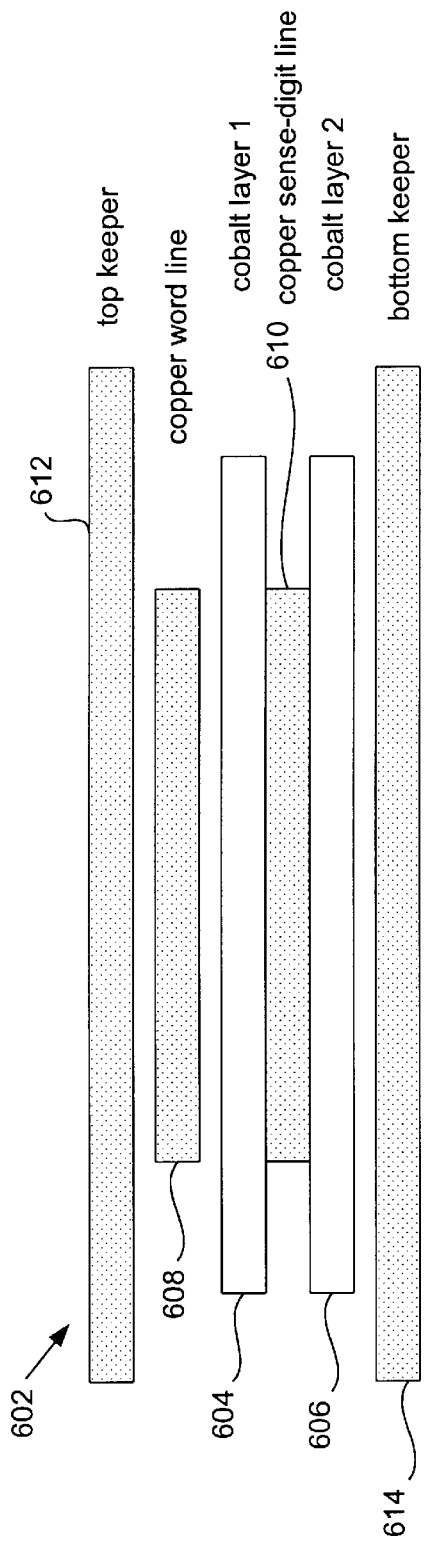
FIG. 6 shows a dibit memory cell designed according to a specific embodiment of the invention.

FIG. 6 shows a memory cell 602 configured to store two bits of information. Cobalt layers 604 and 606 are provided in which the individual bits of information are to be stored as represented by the magnetization vector associated with each. According to a specific embodiment, the coercivities of layers 604 and 606 are substantially equal. A copper word line 608 and a combined copper sense-digit line 610 are provided to provide read and write access to cell 602. Top and bottom keepers 612 and 614 are provided to ensure that memory cell 602 is a substantially closed flux structure. Such a double keeper configuration cancels any demagnetizing field from a magnetic film but does not impede the field from a strip line.

It should be noted that insulation layers are represented by the blank spaces between the layers shown. These layers were omitted for purpose of clarity. In addition, the various layers are shown having different widths for illustrative purposes. However, the layers of actual embodiments are typically the same width. Finally, it will be understood that the vertical dimension of the figures of the application are often exaggerated for illustrative purposes.

A memory module based on the memory cell of FIG. 6 may be similar to a memory module based on the single-bit memory cell of U.S. Pat. No. 5,587,943 incorporated by reference above. That is, such a memory module may have serpentine word lines generally oriented in the x-direction and sense-digit lines generally oriented in the y-direction as shown, for example, in FIG. 11. In such embodiments, the word and sense-digit lines run in the same direction at each bit location. Selection matrices are provided for selecting the word and sense-digit lines as well as low level gates and sense amps for the sense-digit lines. According to other embodiments of the invention, memory cells and modules are designed such that the word lines are straight and orthogonal to separate sense and digit lines as shown, for example, in FIGS. 12(a) and 12(b).

One can understand how to write to the dibit memory cell 602 of FIG. 6 by application of the right hand rule. That is, when the current in word line 608 is parallel to that in sense-digit line 610 and the amplitudes are equal, the field between these lines is zero, i.e., cobalt layer 604 experiences no applied field. However, the field experienced by cobalt layer 606 is the sum of the field contributions from the two lines. Thus, cobalt layer 606 may be written using coincident currents of the same polarity in lines 608 and 610, each of which may generate a field which by itself could not overcome the coercivity of layer 606 (i.e., less than $H_C$), but which, when combined with the field from the other line is sufficient to impose a magnetization on layer 606 (i.e., greater than $H_C$).

When, on the other hand, the current in word line 608 is antiparallel to that in sense-digit line 610 and the amplitudes of the currents are substantially equal, the combined field outside of lines 608 and 610 is effectively zero while the field between the lines, i.e., the field experienced by cobalt layer 604, is doubled. Thus, cobalt layer 604 may be written using coincident currents in the word and sense-digit lines of opposite polarity, each of which may have a field less than $H_C$ but whose combined sum is greater than $H_C$.

According to a specific embodiment, the procedure for reading dibit memory cell 602 involves several steps. Initially, the resistance of sense-digit line 610 is measured. A logic state, e.g., a "1", is then written to cobalt layer 604 with coincident currents in access lines 608 and 610 as described above. The resistance of sense-digit line 610 is then measured again. If it has changed, it is determined that the initial state of layer 604, i.e., the bit of information originally stored in layer 604, is different than the current state, e.g., if the layer was written as a "1" it must have previously been a "0". If the resistance has not changed, the opposite conclusion is established, i.e., that the bit of information originally stored in layer 604 is the same as in the current state.

The state of layer 606 may subsequently be determined by reversing the state of layer 604 and comparing the resulting resistance to the last resistance measurement. The state of layer 606 may then be determined from whether the resistance increases or decreases. For example, if the top layer is switched from a "1" to a "0" and the resistance decreases, the bottom layer must be a "0", i.e., the magnetization vectors of the two layers are now aligned. By contrast, if in such a scenario the resistance increased after such a switch, the bottom layer must be a "1", i.e., the magnetization vectors of the two layers are now antiparallel. After a read operation, the original states of layers 604 and 606 may be rewritten as required.

Of course, it will be understood that a read operation may be performed to determine the state of both of the storage layers as described above, or to determine the state of either of the films separately.

It will be understood that variations on the structure of memory cell 602 may be made without departing from the scope of the present invention. For example, the respective coercivities or compositions of storage layers 604 and 606 may be varied. In addition, the current amplitudes of the current used to access memory cell 602 need not necessarily be equal to enable operation according to the principles of the present invention.

Figure 7:
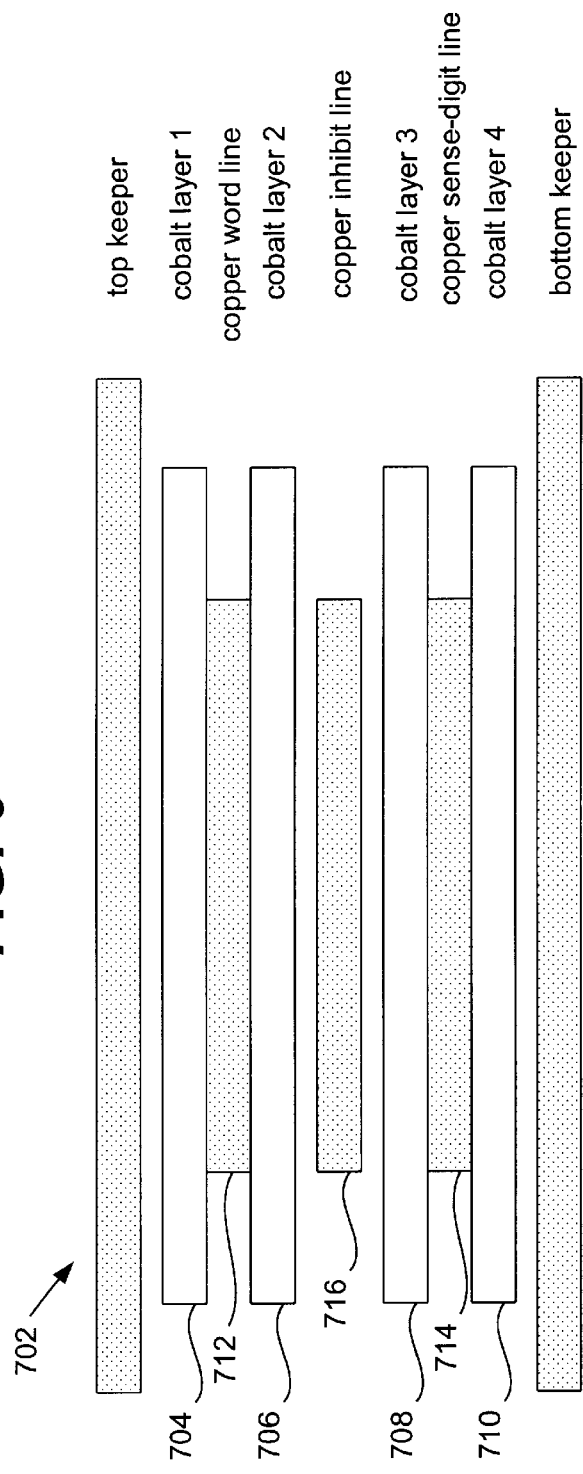
FIG. 7 shows a triple or quad bit memory cell designed according to another specific embodiment of the invention.

FIG. 7 shows a memory cell 702 which may be configured according to various specific embodiments to store three or four bits of information. As with memory cell 602 of FIG. 6, insulating layers in the gaps between layers are not shown and the vertical dimension is exaggerated for clarity. In addition, in an actual embodiment, the films and access lines would likely be the same width but are differentiated here for illustrative purposes.

Memory cell 702 has four cobalt storage layers 704, 706, 708 and 710 each of which is capable of storing one bit of information. The cell access lines include a copper word line 712, a copper sense-digit line 714, and a copper inhibit line 716. The term "inhibit line" is used in reference to the inhibit line of the old ferrite core memories which employed three wires per cell. According to a specific embodiment of the invention, an inhibit line allows a 3:1 ratio of field at selected to unselected locations, which is larger than the 2:1 ratio when there is no inhibit line. According to some embodiments, the inhibit line of the present invention links all of the bits in an array. According to other embodiments, the inhibit line does not link all bits in the array. Rather they are configured to run diagonally through the array and are furnished with their own selection matrix.

As will become apparent, in three-bit embodiments, the magnetization states of storage layers 704 and 710 (and thus the information stored therein) are not independent. That is, each is magnetized in the opposite direction of the other. According to other embodiments (discussed below), this symmetry can be broken using a variety of techniques such that each of the four storage layers may be written and read independently.

According to the three-bit embodiment, the storage layers of memory cell 702 are characterized by substantially equal coercivities and may be written by the application of different combinations of coincident currents in the three access lines. The fields generated as a result of the applied currents are given by:

$$H_1 = k\{-I_w - I_i - I_d\} \quad (1)$$

$$H_2 = k\{I_w - I_i - I_d\} \quad (2)$$

$$H_3 = k\{I_w + I_i - I_d\} \quad (3)$$

$$H_4 = k\{I_w + I_i + I_d\} \quad (4)$$

where $I_w$, $I_i$, and $I_d$ correspond to the currents in the word, inhibit, and sense-digit lines, respectively, $H_1$–$H_4$ are the fields in layer 704–710, respectively, and k is a constant of proportionality inversely proportional to the line width and equal to $2\pi$ Oe per ma for a 1 micron width.

From these equations, it can be seen that layers 706 and 708 may each be switched with a current pulse combination that will not switch any other film in the cell. For example, if $I_w = +H_c/3k$ and $I_i = I_d = -H_c/3k$, then the field at layer 706 is $H_c$, while the field at layers 704 and 708 is $H_c/3$ and the field at layer 710 is $-H_c/3$. That is, there is a three-to-one ratio between the field at the desired storage layer and each of the other storage layers. It can also be seen, however, that in this particular embodiment where the coercivities of layers 704 and 710 are substantially equal, these layers do not switch independently. That is, a field combination that switches one of these two layers will switch the other in the opposite direction. Thus, in such an embodiment where layers 704 and 710 are interdependent in this way, only three bits of information may be stored in or retrieved from memory cell 702.

To effect reading of the information in three-bit memory cell 702, the control electronics for word line 712 and sense-digit line 714 are the same. That is, low-level gates and pre-amps are situated at the ends of each making the word lines, in effect, word-sense lines. The reading of an individual cobalt storage film is achieved in much the same way as described above with regard to dibit memory cell 602. That is, the resistance of the access line to which the storage film of interest is attached is measured. A logic state is then written to the storage film of interest and the resistance of the associated access line measured again. If the resistance changes, the storage film was originally in the opposite state of the logic state that was just written. If the resistance does not change, then the current logic state is the same as the original logic state. Also as described above with reference to dibit memory cell 602, the state of the other storage film associated with the same access line may be determined by switching the first film again and determining whether the resistance goes up or down.

According to various specific embodiments, memory cell 702 is modified such that all four storage layers may be used to store independent bits of information. That is, memory cell 702 has enough storage layers to store four bits of information. However, as discussed above, if the coercivities of the layers are substantially equal, any current pulse sequence which writes storage layer 704 to a particular logic state will also write storage layer 710 to the opposite state.

According to a first embodiment, memory cell 702 becomes a four-bit memory cell with the addition of another access line (placed, for example, above cobalt layer 1) to break the symmetry which results in the interdependency of layers 704 and 710. This embodiment requires an additional masking level and an additional selection matrix to control the added access lines.

According to a second embodiment, the compositions of storage layers 704 and 710 are made sufficiently different such that their switching thresholds require different field strengths for switching. This may be accomplished, for example, by depositing a permalloy layer directly over the cobalt film of storage layer 704. This will give layer 704 a lower coercivity than layer 710. Thus, when coincident currents are applied to the access lines, the resulting fields will write layer 704 before writing layer 710.

According to a third embodiment, the separation spacing between the keepers and the cobalt storage films is adjusted such that demagnetizing fields become significant enough to break the symmetry. This embodiment takes advantage of the fact that even a perfect keeper doesn't completely cancel the demagnetizing field of a finite size magnetic film spaced a nonzero distance from the keeper. Such a demagnetizing field is proportional to the distance between the magnetic filed and the keeper. This demagnetizing field can be used to break the symmetry and allow both layer 704 and layer 710 to be written to the same state. For example, if one wishes to write a "0" to both layers 704 and 710, a pulse combination may first be applied which writes a "1" to layer 704 and a "0" to layer 710. A "1" is then written into each of layers 706 and 708. This results in a demagnetizing field which tends to bias layers 704 and 710 toward the "0" state. Thus, when a subsequent pulse combination is applied which tends to write layer 704 in the "0" state and layer 710 in the "1" state, only layer 710 is switched. This leaves both layers 704 and 710 in the same state, e.g., "0". Layers 706 and 708 may then be written independently.

According to a fourth embodiment, a keeper layer replaces a portion of the center of line 716. This shields layers 704, 712 and 706 from the field generated by currents in layer 708, 714 and 710, and vice versa. This removes the redundancy and allows four bits of information to be independently stored.

The four-bit embodiment of memory cell 702 may be read in much the same way as the three-bit embodiment described above. According to a specific embodiment, this may be done by switching only the interior bits (i.e., layers 706 and 708) and using the read procedure described with reference to the dibit memory cell 602 of FIG. 6.

Figure 8:
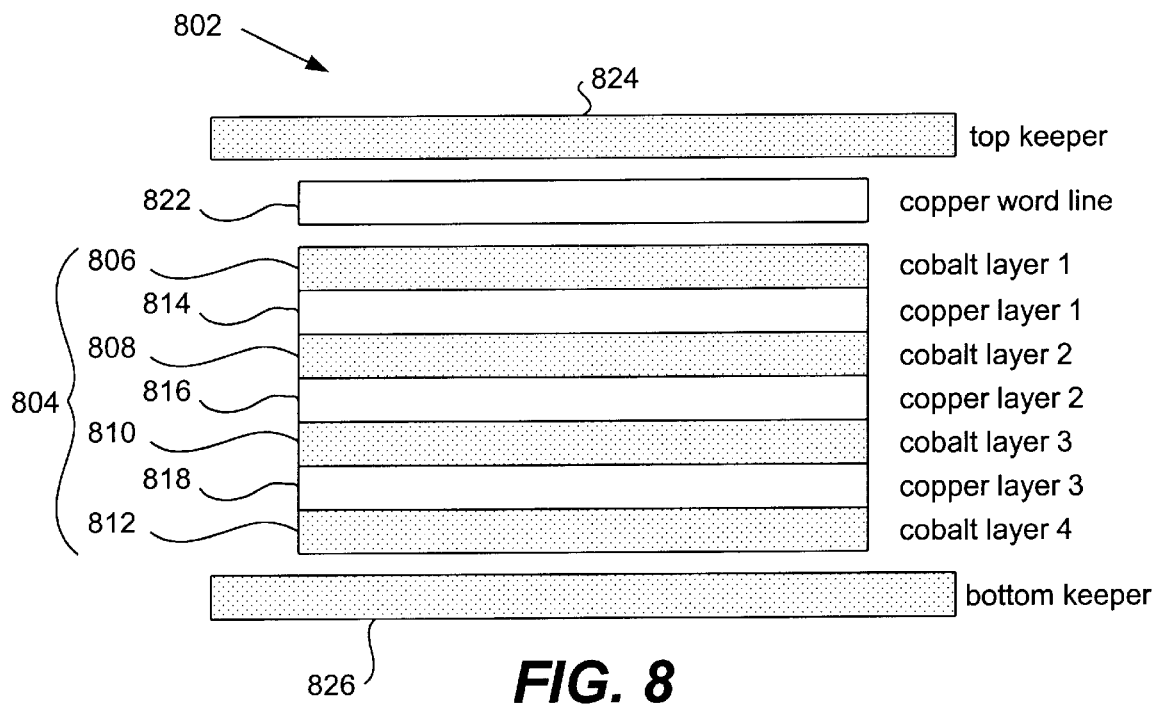
FIG. 8 shows a dibit memory cell designed according to yet another specific embodiment.

According to further specific embodiments of the present invention, multi-layer memory cells are stacked to achieve increased information storage density. A double-density stacked memory cell 802 designed according to one such embodiment is shown in FIG. 8. According to various embodiments, this structure may be employed for 2-bit NDRO or 4-bit DRO. Memory cell 802 includes a GMR film structure 804 which functions as the sense-digit line of the cell. According to the specific embodiment shown, structure 804 is a multi-layer GMR structure having four cobalt layers 806, 808, 810, and 812, separated by three copper layers 814, 816, and 818. The cell also includes a copper word line 822 and top and bottom keepers 824 and 826. The purpose of the double keeper is to cancel the demagnetizing fields from the magnetic films while not impeding the fields from the access lines. For illustrative purposes, insulating layers located in the blank spaces between noncontiguous layers are not shown and the vertical dimension of the cell is exaggerated.

Figure 9:
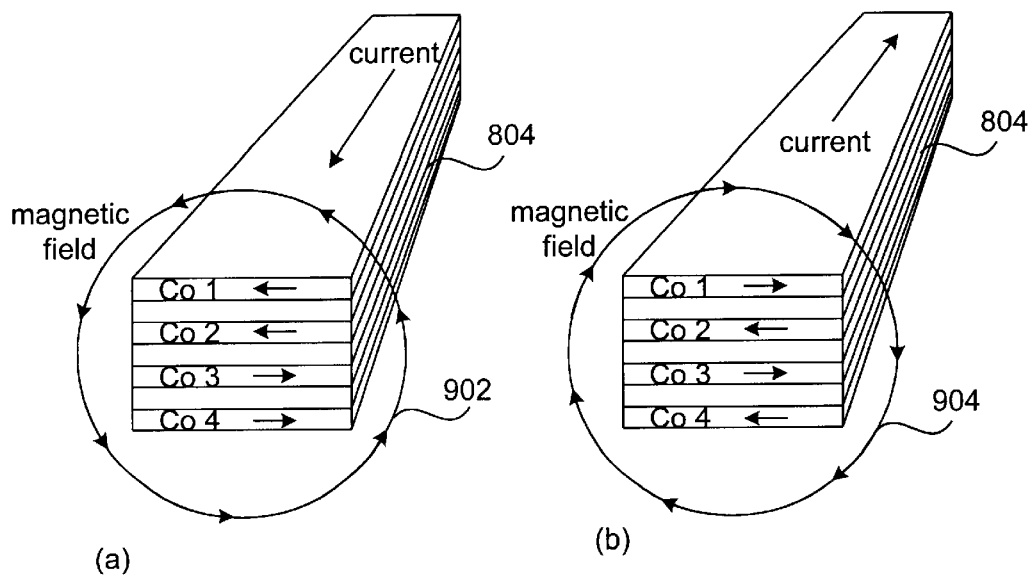
FIG. 9 shows the relationship between magnetic fields and current in a GMR thin film structure.

The reading and writing of memory cell 802 will now be described with reference to the FIGS. 9(*a*) and 9(*b*) which show the resulting magnetic fields from opposing currents in multi-layer GMR structure 804. Current flowing out of the page through GMR structure 804 generates a magnetic field 902 as shown in FIG. 9(*a*). The field is oriented to the left in the top two cobalt storage layers 806 and 808 and to the right in the bottom two cobalt storage layers 810 and 812. As will be understood, magnetic field 902 is stronger at layers 806 and 812, weaker at layers 808 and 810, and zero at the center of the structure.

In FIG. 9(*b*), the direction of the current is reversed, i.e., into the page, and reduced in magnitude such that the coercivities of the inner layers 808 and 810 are not overcome by magnetic field 904. This results in the switching of layers 806 and 812 but not layers 808 and 810 as shown. The result is that each cobalt film is magnetized antiparallel to its neighbor(s), a configuration which yields the highest magnetoresistance of sense-digit line 804.

Because the conductivity of copper is much larger than that of cobalt, the approximation that all of the current in sense-digit line 804 is carried by the copper layers may be made. Using this approximation, it can be seen that the magnitudes of the fields in layers 806 and 812 are approximately three times the magnitudes of the fields in layers 808 and 810. For example, the field experienced by cobalt layer 808 from copper layer 814 is cancelled by the field from copper layer 816, leaving only the field component from copper layer 818. By contrast, cobalt layer 806 experiences positive field contributions from each of the copper layers. This difference in field magnitude is the basis for operating the stacked memory cells of the present invention.

The writing of the dibit memory cell 802 according to a specific embodiment of the invention will now be described with reference to FIGS. 8 and 9. According to this embodiment, the two inner cobalt layers 808 and 810 are used to store the information, and the two outside cobalt layers 806 and 812 are used to read out the information nondestructively, i.e., NDRO. The memory cell is written with a coincidence of currents in word line 822 and sense-digit line/GMR structure 804. Because, as discussed above, a current in sense-digit line 804 results in a much larger field at the outer cobalt layers than at the inner cobalt layers, it is possible to switch the outer layers without disturbing the inner ones.

A current in sense-digit line 804 will result in a magnetic field in cobalt layer 808 which is equal and opposite to the field experienced by cobalt layer 810. When a coincident current is applied to word line 822, the resulting field will add to the field in one of layers 808 and 810 and subtract from the other. This makes it possible to write to either one of layers 808 or 810 without disturbing the other. So, for example, to write to layer 810, a current which produces a field of magnitude $H_C/2$ at layer 810 is applied to sense-digit line 804 in the direction out of the page (see FIG. 9). A current one-third as large is coincidentally applied to word line 822 in the same direction resulting in another field of magnitude $H_C/2$ at layer 810. The combined field has a magnitude Hc which is sufficient to switch layer 810. However, because the first field contribution at layer 808 is $-H_C/2$, the two fields cancel and layer 808 does not switch.

To read the information stored in dibit memory cell 802 the magnitude of the read current in sense-digit line is ⅓ of that of the write current. This results in a field of $H_C/2$ at layer 806 and $-H_C/2$ at layer 812. The resulting fields at layers 808 and 810 are of magnitude $H_C/6$ and will therefore not cause any switching of these layers. To read the information in layer 808, layer 806 is written, i.e., magnetized, in a first direction and the resistance of sense-digit line 804 is measured. Layer 806 is then written in the other direction and the resistance measured again. The two resistance measurements are then compared. The resistance will be lower when layers 806 and 808 are magnetized in the same direction, and higher when they are magnetized in opposite directions. Therefore, the direction of magnetization of layer 808, i.e., the logic state stored in layer 808, may be determined from the comparison of the resistance values. The reading of layer 810 is achieved using the same procedure with layer 812.

Figure 10:
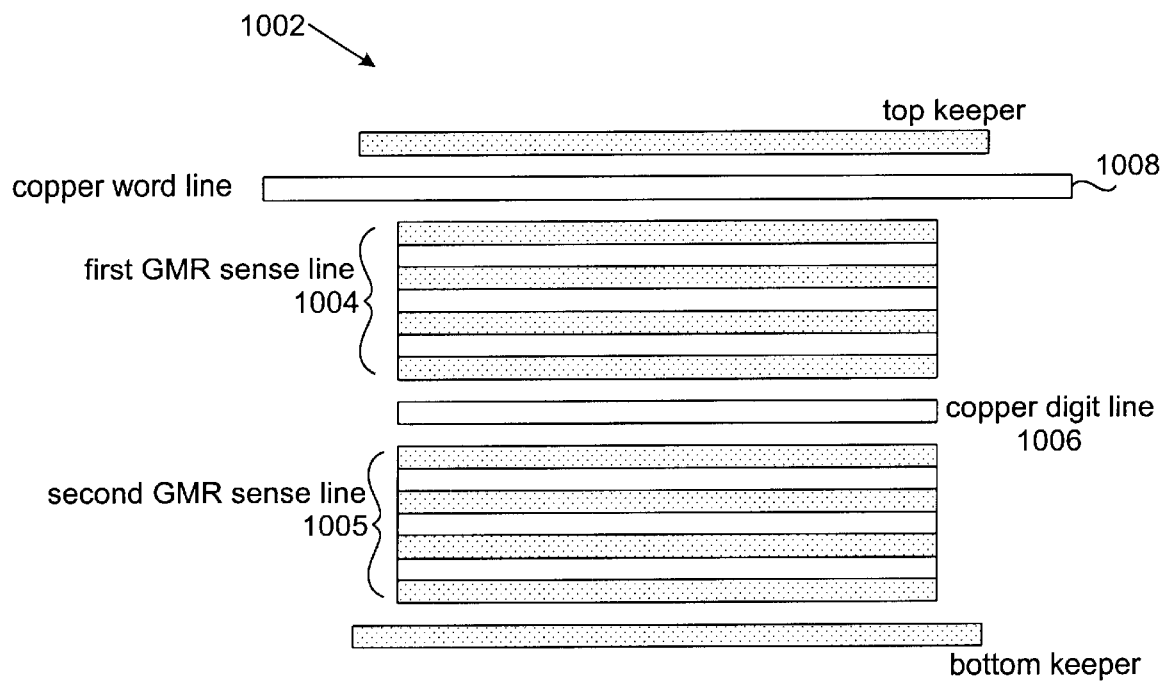
FIG. 10 shows a quad bit memory cell designed according to a further embodiment of the invention.

A quadruple-density stacked memory cell 1002 designed according to another embodiment of the present invention is shown in FIG. 10. Memory cell 1002 includes two GMR film structures 1004 and 1005 which function as sense lines of the cell. According to a specific embodiment of the invention, each of structures 1004 and 1005 is designed similarly to the GMR film structure 804 shown in FIGS. 8, 9(a) and 9(b). That is, the embodiment shown in FIG. 10 stacks two of the single GMR structure of dibit memory cell 802 of FIG. 8 to effect storage of 4 bits of information NDRO or 8 bits DRO.

As with dibit cell 802, the four bits of information of quadbit cell 1002 are stored in the two center cobalt layers of each of sense lines 1004 and 1005. The fields on the top and bottom data bit layers of sense line 1004 will be denoted $H_1$ and $H_2$, respectively. The fields on the top and bottom data bit layers of sense line 1005 will be denoted $H_3$ and $H_4$, respectively. The term k will be used to represent the constant of proportionality between the magnetic field and current on the surface of a stripline having the width of those in the memory (k=2π Oe/ma for a line 1 micron wide, and is inversely proportional to the width of the stripline). The current in top sense line 1004 will be denoted $i_1$. The current in copper digit line 1006 will be denoted $i_2$. The current in bottom sense line 1005 will be denoted $i_3$. Using these definitions, the four fields at the four information storage layers are given by:

$$H_1 = k(i_1/3 + i_2 + i_3) \tag{5}$$

$$H_2 = k(-i_1/3 + i_2 + i_3) \tag{6}$$

$$H_3 = k(-i_1 - i_2 + i_3/3) \tag{7}$$

$$H_4 = k(-i_1 - i_2 - i_3/3) \tag{8}$$

NDRO quadbit cell 1002 has the same control electronics for each of its two sense lines 1004 and 1005 as sense-digit line 804 of dibit cell 802, i.e., low level gates and preamps. From equations 5–8, it can be seen that each of the four information storage layers of quadbit cell 1002 may be written independently of the others by the appropriate combination of coincident current pulses in sense lines 1004 and 1005, digit line 1006 and word line 1008.

The read and write techniques described above with reference to dibit memory cell 802 of FIG. 8 may also be used to read the information stored in NDRO quadbit memory cell 1002. So, for example, a read would begin with measurement of the resistance of the sense line of which the storage layer of interest is a part. A particular logic state, e.g., a "1", is then written to the outside cobalt layer nearest the storage layer of interest, i.e., the outside layer is magnetized in a specific direction. The resistance of the sense line is then measured and compared to the resistance prior to the first pulse. If there is a change in resistance, the bit value of the inner storage layer is determined from a comparison of the two resistance measurements. That is, if a "1" was written to the outside layer and a positive change in the resistance of the sense lines is measured, then the inner layer is storing a "0", i.e., magnetized antiparallel to the outer layer; if a negative resistance change is measured, then the inner layer is storing a "1". On the other hand, if there is no change after the first pulse, then the opposite logic state, e.g. a "0", is written to the outside film, the resistance of the sense line is again measured, and the bit value is determined from a comparison of the three resistance measurements. That is, if the resistance change after the second pulse is positive, the inner layer is a "1", i.e., magnetized parallel to the outer layer; if the resistance change is negative, the inner layer is a "0". See FIG. 5. Note that this procedure can be used to read out all eight bits of a DRO 8-bit cell. If cell 1002 is used as an 8-bit DRO nonvolatile cell, the center copper digit line 1006 should be replaced by three layers, the top and bottom made of copper and the center a permalloy keeper.

Figure 11:
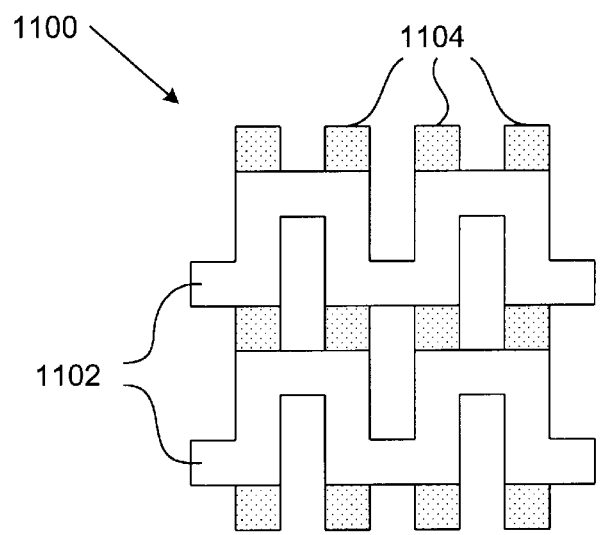
FIG. 11 is a simplified diagram of an array of memory cells designed according to the invention.

According to a specific embodiment of the present invention, various memory cells of the present invention may be configured into a memory array 1100 as shown in FIG. 11. The memory cells of the array are situated where serpentine word lines 1102 coincide with the vertical access lines 1104 which may comprise, for example, multi-layer sense-digit lines as in dibit cell 802, or separate sense and digit lines as in quadbit cell 1002.

Figure 12A:
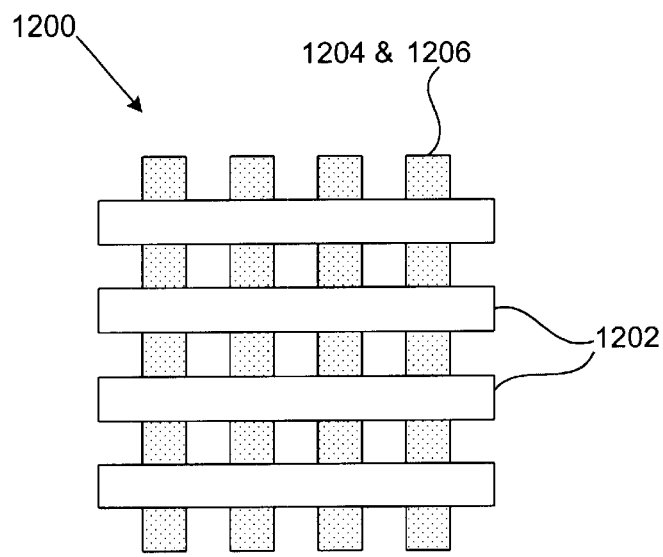
FIG. 12(a) is a simplified diagram of another array of memory cells according to another embodiment.
Figure 12B:
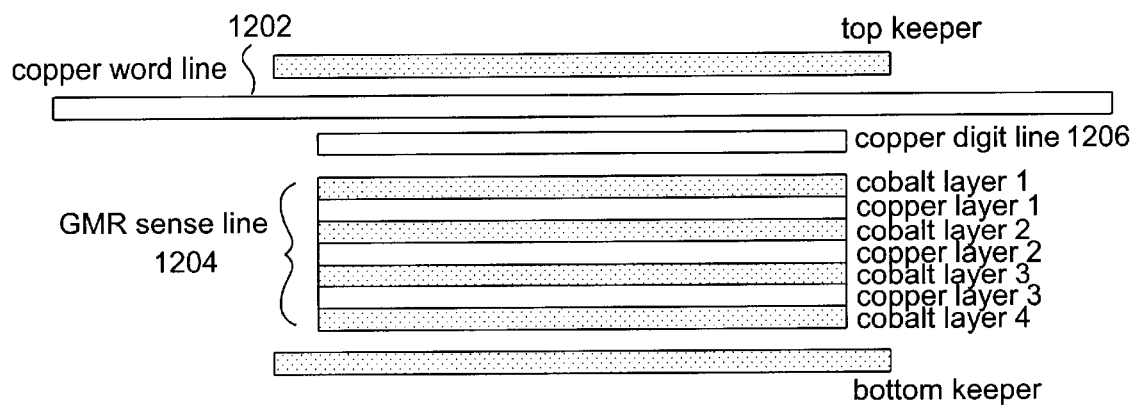
FIG. 12(b) shows yet another dibit memory cell designed according to the invention.

According to other embodiments, the bit density of the dibit and quadbit memory cells of the present invention may be further doubled by changing the shape of the word lines in an array 1100 of such devices and using separate sense and digit lines. This may be understood with reference to FIGS. 12(a) and 12(b). According to such embodiments word lines 1202 are straight and orthogonal to separate sense and digit lines (1204 and 1206, respectively). FIG. 12(*b*) shows a dibit cell embodiment. However, it will be understood that the same principle may be applied to a quadbit cell embodiment.

As can readily be seen by comparing the array design of FIGS. 11 and 12(*a*), the spacing between the word lines in array 1200 is decreased by a factor of two as compared to array 1100 with an attendant twofold increase in bit density. It should be noted that although the field from the word lines in array 1200 is perpendicular to the film easy axis, this field lowers the switching threshold of the cells beneath it with the result that only the portions of the magnetic films under an activated word line get switched. This enables one to switch one and only one bit in a given sense line.

Referring back to FIG. 1, the support electronics which provide random access to each of memory cells 102 are implemented with the GMR-based device referred to herein as a "transpinnor." A transpinnor is a multifunctional, active GMR device with characteristics similar to both transistors and transformers. Like a transistor, it can be used for amplification, logic, or switching. Like a transformer, the transpinnor can be used to step voltages and currents up or down, with the input resistively isolated from the output. Like a transistor, a transpinnor can be integrated in a small space. Unlike conventional transformers, a transpinnor has no low frequency cutoff, the coupling being flat down to and including DC. In addition, the operational characteristics of the transpinnor (including amplification, current requirements, and speed) tend to improve as its dimensions get smaller. For more information on transpinnors, please refer to U.S. Pat. Nos. 5,929,636 and 6,031,273 for ALL-METAL, GIANT MAGNETORESISTIVE, SOLID-STATE COMPONENT, the entire disclosures of which are incorporated herein by reference for all purposes.

Figure 13:
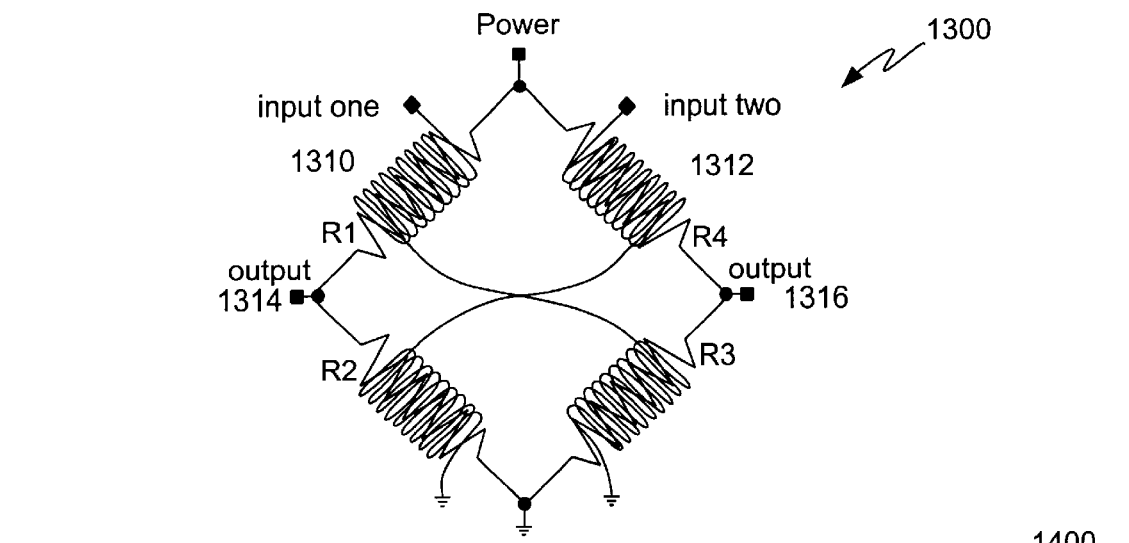
FIG. 13 is a simplified circuit diagram of a transpinnor for use with specific embodiments of the present invention.

A specific implementation of a transpinnor 1300 is shown in FIG. 13. Four resistive elements $R_1$–$R_4$ comprising GMR film structures are configured as a Wheatstone bridge. Current in either of input lines 1310 or 1312 creates a magnetic field of one or more of GMR films $R_1$–$R_4$. This unbalances the bridge and creates an output signal between output terminals 1314 and 1316. In the transpinnor implementation of FIG. 13 input lines 1310 and 1312 are shown inductively coupled to resistive elements $R_1$–$R_4$ with coils. According to other integrated circuit embodiments, this coupling is achieved using striplines.

As mentioned above, the resistance of each leg of transpinnor 1300 may be changed by application of a magnetic field to manipulate the magnetization vectors of the respective GMR film's layers. Such fields are generated by the application of currents in input lines 1310 and 1312 which are electrically insulated from the GMR films. Input line 1310 is coupled to and provides magnetic fields for altering the resistance of GMR films $R_1$ and $R_3$. Input line 1312 is coupled inductively to and provides magnetic fields for altering the resistance of GMR films $R_2$ and $R_4$. If the resistances of all four GMR films are identical, equal currents in input lines 1310 and 1312 change the resistances equally and do not unbalance the bridge, thus resulting in zero output. If, however, unequal currents are applied, an imbalance results, thus resulting in a nonzero output.

Figure 14:
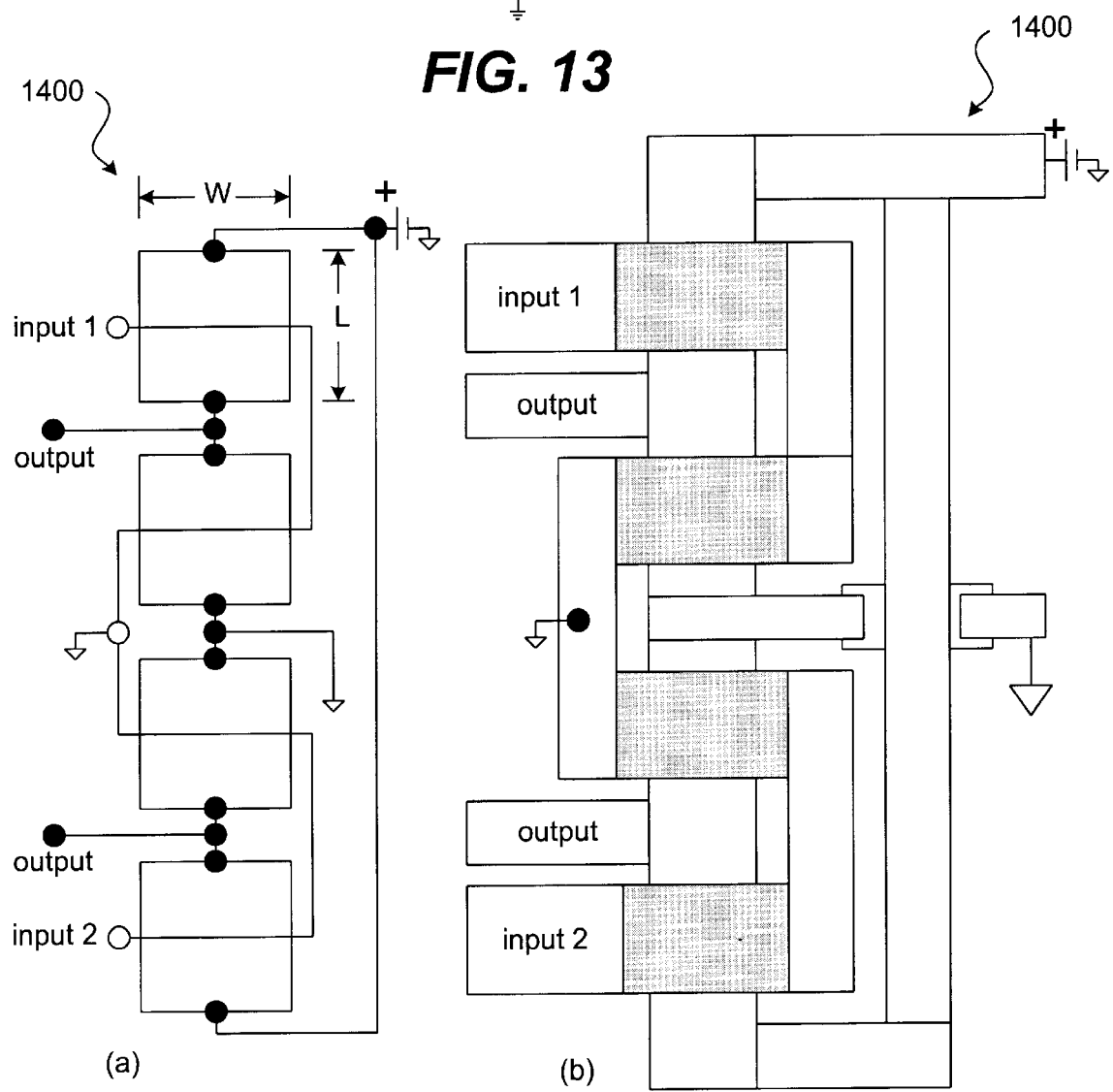
FIGS. 14(a) and 14(b) are simplified representations of a differential transpinnor for use with specific embodiments of the present invention.

FIG. 14 shows a circuit diagram (a) and an integrated circuit layout (b) of an integrated circuit implementation of a differential transpinnor 1400 for use with specific embodiments of the present invention.

The relationship between the output voltage of transpinnor 1300 and a variety of other parameters including power supply voltage, input current, GMR value, leg resistance values, and output resistance will now be described. This analysis assumes the ideal case where the resistance of each of four resistive elements $R_1$–$R_4$ (when in identical magnetic states) is identical, and denotes this resistance value as r. When a positive current is applied at input 1 and a negative current is applied at input 2, the various resistances are given by:

$$R_1 = r(1-\delta) \tag{9a}$$

$$R_2 = r(1+\delta) \tag{9b}$$

$$R_3 = r(1-\delta) \tag{9c}$$

$$R_4 = r(1+\delta) \tag{9d}$$

Where $$\delta = f(H)\ gmr/2 \tag{10}$$

gmr is the decimal equivalent of GMR (i.e., gmr=GMR/100), and f(H) is a number less than or equal to one, representing the fraction that a layer has switched.

The output resistance of transpinnor 1300 is denoted $r_5$. The current in each of resistive elements $R_1$–$R_4$ and $r_5$ denoted $i_1$–$i_5$, respectively. The voltage drop across the entire bridge, i.e., the voltage applied to the power lead) is denoted V. From Kirchoff's laws we then have $$i_1 - i_2 - i_5 = 0 \tag{11a}$$

$$i_4 - i_3 + i_5 = 0 \tag{11b}$$

and from symmetry, $$i_1 = i_3 \tag{12a}$$

$$i_2 = i_4 \tag{12b}$$

Because the voltage drop over any path between the power lead and ground must be V, $$(1-\delta)r i_1 + (1+\delta)r i_2 = V \tag{13}$$

$$(1-\delta)r i_1 + i_5 r_5 + (1-\delta)r i_1 = V \tag{14}$$

Combining equations (11), (13), and (14), $$i_5 = 2 i_1 \delta / [1 + \delta(r_5/r)] \tag{15a}$$

This equation represents the output current of transpinnor 1300.

Also of interest is the dependence of the amplification factor, $$A = \text{output current/input current} \tag{16}$$

on the power supply to transpinnor 1300 and the line width of the GMR films. For this analysis will use the approximation that $r_5/r \ll 1$. This is due to the fact that the input and output lines of transpinnor 1300 are much thicker than the GMR films (e.g., 20 nm of copper and 300 nm of AlCu vs. 2–4 nm of copper). In addition, δ also (see equation 10). In the case of complete switching, equation 15a then becomes $$i_5 = 2 i_1 \delta = i_i gmr \tag{15b}$$

The input current must be sufficient to switch the lower coercivity, e.g., permalloy layer of the GMR films, i.e., sufficient to produce a magnetic field equal to the layer coercivity, $H_C$. The field H produced by a current i in a stripline of width w and length L is found from Maxwell's equation, curl H=J', to be $$H=2\pi i/w \text{ Oe} \quad (17)$$

where i is in mA and w is in microns. (In changing units from Maxwell's equation to those in equation (17) it should be noted that $4\pi$ Oe=$10^3$ amps/meter.) Thus, the input current required to produce a field $H_C$ is $$\text{input current}=(\tfrac{1}{2}\pi) H_C \text{ w mA/(Oe-micron)} \quad (18)$$

To derive the output current, it should be noted with reference to FIG. 13 that the power voltage V is applied to $R_1$ and $R_2$ in series, and that because $i_5$ is small, the current in resistive elements $R_1$ and $R_2$ can be approximated as $i_1$. Thus, the current $i_1$, according to Ohm's law, is the ratio of V (in volts) to the sum of $R_1$ and $R_2$, or 2r (in ohms). So, $i_1=10^3$ V/(2r) mA, and therefore according to equation (15b) the output current is $$\text{output current}=10^3 \text{ gmr V/(2r) mA} \quad (19)$$

The amplification factor is then $$A=\pi 1000 \text{ gmr V/(r } H_C \text{ w)} \quad (20a)$$

It is further useful to write the resistance r as the sheet resistivity, $R_{sq}$ (ohms per square) multiplied by the number of squares. The number of squares of one of the GMR resistive elements of FIG. 14 is L/w. Thus, the amplification may be written $$A=\pi 1000 \text{ gmr V/(} H_C L R_{sq}) \quad (20b)$$

where $H_C$ is in Oe, and w and L are in microns.

As discussed above, transpinnors form the basis for the all-metal support electronics for memory 100 of FIG. 1. That is, transpinnors are used to select the word lines to be activated (104), select the sense-digit and reference lines to activated (106), regulate the voltage to the drive lines (108), amplify the difference in current between selected sense-digit and reference line pairs (110), and perform further sense amplification in successive stages.

It turns out that the transpinnor is extremely effective for applications in which a physical signal is to be read above an offset arising from the difference between two unevenly match input lines. It functions as a transformer at its input, rejecting the common-mode signal between the two lines, and as a differential amplifier at its output, amplifying the physical signal. In memory 100 there is a differential transpinnor 110 coupled to each sense-digit/reference line pair such that the sense-digit line is connected to input 1 of the transpinnor and the corresponding reference line is connected to input 2 (see FIGS. 13 and 14). As discussed above, inputs 1 and 2 of each transpinnor are only inductively coupled to its GMR film resistive elements, the input being DC isolated from the output.

When the sense-digit and reference lines of a pair are in the same magnetic state, the output of the differential transpinnor 110 should be zero. However, because of imperfections arising in the fabrication process, the resistance of a sense-digit line will typically be different than that of its reference line. Consequently, when the same voltage is applied to the two lines, different currents enter the two inputs of the associated differential transpinnor 110 causing a nonzero output, and thus the potential for error. According to a specific embodiment of the present invention, the differential transpinnor 110 for each sense-digit/reference line pair may be trimmed to compensate for this imbalance.

That is, compensation for the resistive imbalance is achieved by reducing the output of the transpinnor through at least partial reversal of one of the high coercivity, i.e., cobalt, layer. According to a specific embodiment, the other side of the transpinnor is operated with the high coercivity layer(s) saturated. The low coercivity layer(s) remains free to react to the input current, thereby producing the dynamic output. By reversing just the right percentage of the cobalt layer, the output of the transpinnor can be made to go to zero when the reference and sense-digit lines are in the same magnetic state, i.e., when it is supposed to be zero.

Equation (15b) represents the case where the currents of inputs 1 and 2 are equal in magnitude and of opposite polarity. When the currents are of the same polarity and different magnitude, the equation becomes $$i_5=i_1(\delta_1-\delta_2) \quad (21)$$

Since the two fractional resistance changes are unequal, $i_5$ is nonzero. In equation (10), f(H) is the fraction of the film for which the magnetization of the high coercivity layer and the low coercivity layer (i.e., the cobalt layer and the permalloy layer) are antiparallel less that for which they are parallel. We can therefore write f(H) as the product of two terms, one representing the high coercivity layer and one representing the low coercivity layer, $$f(H)=f_c(H)f_p(H) \quad (22)$$

where $f_c(H)$ is the fraction of the cobalt layer magnetized in the positive direction less that magnetized in the negative direction and $f_p(H)$ is the corresponding fraction for the permalloy layer. This assumes that the layers switch independently of one another which is a reasonable assumption in that the coercivity of cobalt is much higher than that of the permalloy, and the transpinnor is typically operated at low field where only the magnetization of the permalloy changes and that of the cobalt remains fixed. That is, $$f_c(H)=\text{constant} \quad (23)$$

but the values of $f_c(H)$ will in general be different for the two inputs.

The transpinnor can be set up so that the response of the permalloy to the applied field (from the current in the input line) is relatively linear for the current range of interest, i.e., $$f_p=k \text{ I } |f_p|<1 \quad (24)$$

where the value of the proportionality constant k is determined by the shear of the loop. Denote the current from the reference line by $i_{ref}$ and the current from the sense-digit line by $i_{sense}$. Then $$\delta_1=f_{c1}f_p gmr/2=f_{c1}k \text{ } i_{sense} gmr/2 \quad (25)$$

$$\delta_2=f_{c2}f_p gmr/2=f_{c2}k \text{ } i_{ref} gmr/2 \quad (26)$$

Then, by equations (21), (25), and (26), the output current 15 of the transpinnor is given by $$i_5=i_1(\delta_1-\delta_2)=i_1k(gmr/2)(f_{c1}i_{sense}-f_{c2}i_{ref}) \quad (27)$$

Equation (27) reveals that even if the sense current is different than the reference current when the line are in the same magnetic state, the output current $i_5$ can be made zero by adjusting the magnetization in the cobalt film. Thus, for example, if the current in a sense-digit line is greater than that in the corresponding reference line, the currents can be balanced by saturating the cobalt in the reference leg of the transpinnor in the positive direction so that $f_{c2}$=1 and partially reversing the cobalt in the sense-digit leg of the transpinnor such that $f_{c1}=i_{ref}/i_{sense}$. This balances the input, even though the lines have different resistances. The adjustment is facilitated by the fact that the two cobalt layers can be adjusted independently. It should be noted that this technique can compensate for virtually any resistive inequality in a given sense-digit/reference line pair. This is even the case where the difference in resistance is much greater than the films' gmr values.

According to various specific embodiments of the present, there are a number of ways in which a transpinnor may be connected to a sense-digit/reference line pair. Four of these options will now be described with reference to FIG. 15. Each option is shown using coils. However, it will be understood that the present invention contemplates analogous embodiments using striplines. In addition, for the purpose of clarity, each of the embodiments is shown with only the transpinnor's input lines, i.e., omitting the resistive elements.

FIG. 15(a) shows the input lines 1502 and 1504 of a transpinnor configured such that each of the transpinnor's four resistive elements (not shown) is influenced by current from both sense-digit line 1506 and reference line 1508. In the figure this is shown as the coils being configured concentrically with the coils slightly displaced from one another. In a stripline embodiment, the input lines would be striplines deposited on top of the other layers with insulation in between. This configuration has the highest sensitivity for differential amplification of the four shown, but has relatively low sensitivity for trimming unless the overlap of the input lines is only partial.

FIG. 15(b) shows input lines 1512 and 1514 of a transpinnor configured such that the current from sense-digit line 1516 goes through only input line 1512 which supplies magnetic fields to two of the transpinnor's resistive elements, while current from reference line 1518 goes through only input line 1514 which supplies magnetic fields to the other two resistive elements of the transpinnor. Transpinnor 1300 of FIG. 13, for example, is configured for such a connection.

FIG. 15(c) shows input lines 1522 and 1524 of a transpinnor connected in series between the midpoints of sense-digit line 1526 and reference line 1528. In this configuration, the current flowing through the two input lines is proportional to the difference in resistance between them.

FIG. 15(d) shows input line 1532 coupled between sense-digit line 1536 and reference line 1538. Input line 1534 is used to compensate for any intrinsic difference in resistance between them, i.e., to eliminate any offset. This configuration is the least sensitive of the four shown for differential amplification.

Figure 15:
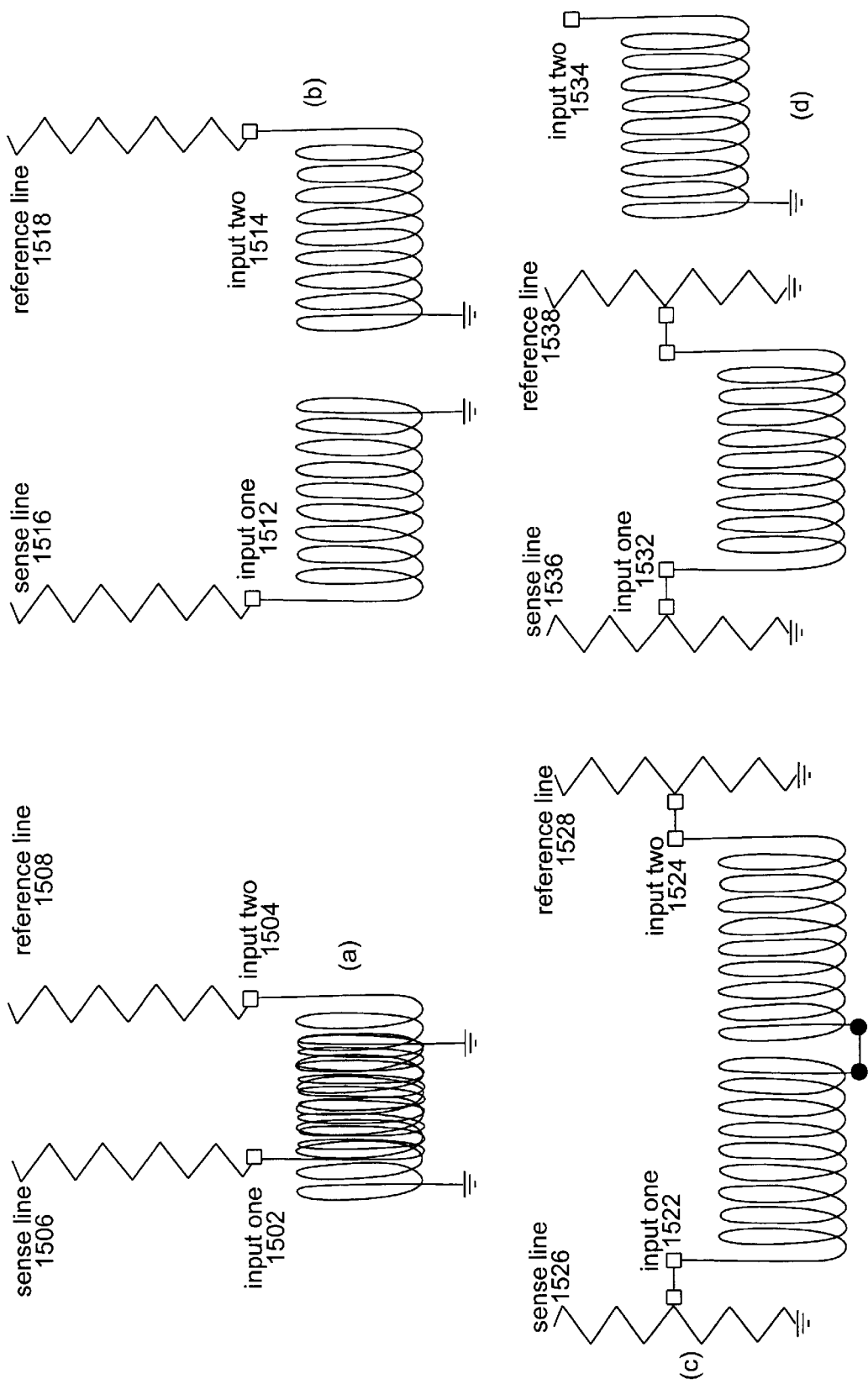
FIGS. 15(a)–15(d) illustrate four different embodiments in which a transpinnor is used to balance a sense-digit/reference line pair.

The four configurations of FIG. 15 lead to four different methods of using transpinnors for resistive trimming.

A differential transpinnor exhibits hysteresis unless operated in a specific way. This hysteresis can be avoided if the transpinnor is biased in the hard direction of the low coercivity (e.g., permalloy) layer with a field greater than or equal to the anisotropy field. This eliminates the hysteresis and the permeability becomes very large. The high coercivity (e.g., cobalt) layer is largely unaffected because its anisotropy field is typically much larger than that of the low coercivity layer. The signal field is applied by the input lines of the transpinnor and is in the easy-axis direction.

A second method which requires no bias field is to fabricate the transpinnor with the easy axis of the low coercivity layer perpendicular to the easy axis of the high coercivity layer. The low coercivity layer thus undergoes uniform magnetization rotation rather than wall-motion switching.

A third method of dealing with transpinnor hysteresis is to initialize the transpinnor the same way before each read operation. For example, each read operation could be started by the application of a negative pulse which switches all the low coercivity layers but not any of the high coercivity layers. This erases any previous low coercivity layer history.

According to a fourth method, the low coercivity layer of the transpinnor is initialized antiparallel to the high coercivity layer, leaving it on the very steep part of the device's hysteresis curve where a small input current will produce a large output.

According to a specific embodiment of the invention, when a transpinnor is used to balance a sense-digit line against its reference line, the resistive elements of the transpinnor are adjusted such that when the sense-digit and reference lines are in identical magnetic states (i.e., with the same number of ones and zeros in the storage layers of the two lines and at the corresponding locations in each, and with the same corresponding magnetizations in the readout layers of the two lines), the transpinnor gives zero output. When a bit is changed on the reference line but not the sense-digit line, the ratio of resistances changes and the transpinnor gives a nonzero output. That is, the transpinnor is adjusted to give zero output not when both input currents are equal, but when the sense-digit line and the reference line are in the same magnetic state. Note that the voltages applied to the two lines are equal, but because the resistances are unequal, the currents in the lines are unequal. Thus, though the supply to the line pair is a constant current, the individual currents in the pair may be different.

During a read operation, the read current through the trimming transpinnor is large enough to switch its low coercivity layer, but not its high coercivity layer. Therefore, the trimming adjustment is made to the high coercivity layer (which remains in the partially switched state during the read operation), not the low coercivity layer (which needs to be free to change in response to the read current). The high coercivity layer in the transpinnor is not affected by write operations because the resistive elements of the transpinnors are not physically connected to the sense-digit lines.

FIGS. 16(a)–16(e) illustrate the effect of the trimming technique of the present invention on the balancing of sense-digit/reference line pairs according to a specific embodiment thereof. Each set of three diagrams corresponds to a transpinnor with specific characteristics. In each set the left most diagram represents the transpinnor output, the middle diagram the output from read signal for a "1," and the right most diagram the output from a read signal for a "0."

When the transpinnor associated with a particular sense-digit/reference line pair is well balanced, i.e., the sense-digit line and the reference line have equal resistances, the outputs for a "1" and a "0" are as shown in FIG. 16(a). When the resistance of the sense-digit line is smaller than that of the reference line, the result is an input current offset represented by the vertical dashed line in FIG. 16(b). The creates the "pedesta" of FIG. 16(b) as a result of which the output for a "0" can be mistaken for that of a "1." If, however, a prep pulse of the appropriate magnitude is applied, the response curve of the transpinnor is shifted as shown in FIG. 16(c), as a result of which the pedestal of FIG. 16(b) is removed.

Similarly, if the resistance of the sense-digit line is greater than that of its corresponding reference line, the result is a pedestal of the opposite polarity as illustrated in FIG. 16(d).

This pedestal may also be eliminated by the application of a prep pulse of the appropriate magnitude which moves the response curve of the transpinnor to the left as shown in FIG. 16(e).

Figure 16:
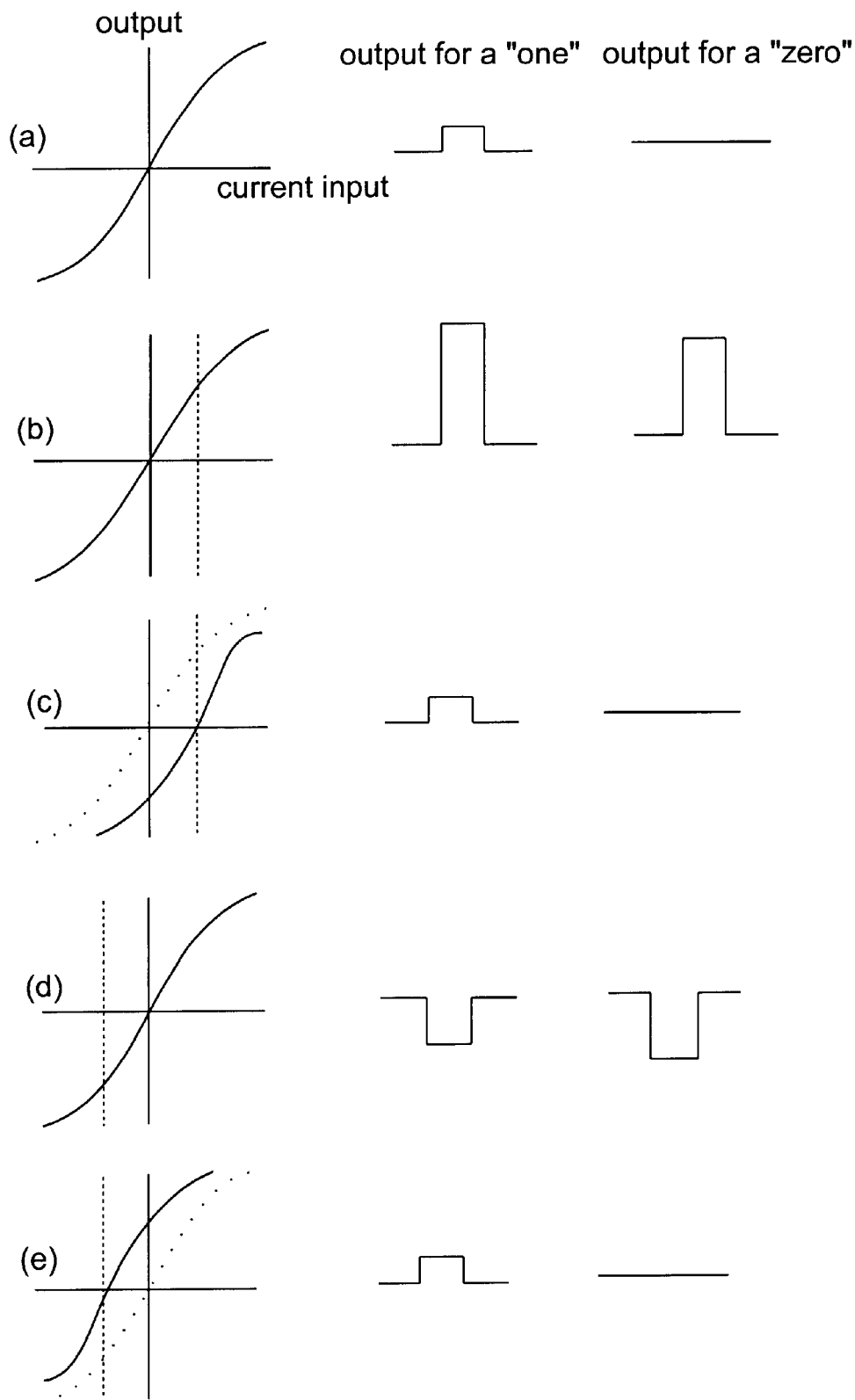
FIGS. 16(a)–16(e) illustrate the effect of the trimming technique of the present invention on the balancing of sense-digit/reference line pairs.

It will be understood with reference to the diagrams of FIG. 16 that by properly balancing a transpinnor coupled to a sense-digit/reference line pair, the additional steps otherwise required for removing the read operation pedestal may be eliminated and the read time correspondingly reduced.

Referring once again to FIG. 1, three types of GMR structures are shown working together to create an operational all metal random access memory or SpinRAM 100. As discussed above, memory cells 102 comprise multi-layer thin film elements each of which stores one or more bits of information. Word and sense-digit selection electronics (104 and 106) and amplifiers 110 comprise transpinnors. Trim resistors 108 are provided for regulating the current to the memory access lines and comprise GMR films the resistance of which may be trimmed by controlling the percentage switching of the films' high coercivity layers (as discussed above with regard to the balancing of a transpinnor).

According to specific embodiments, it is desirable that the GMR films for each of the SpinRAM memory elements 102 have high GMR values to achieve a favorable signal-to-noise ratio. Relatively low coercivities may also be desirable for both the high and low coercivity layers of the memory elements to ensure low switching currents, although the difference in coercivity between the high and low coercivity layers should be sufficiently large to maintain satisfactory operating margins.

The characteristics of the GMR films for the transpinnor-based elements (i.e., 104, 106, and 110) may be similar to those discussed above for the memory elements, but may differ in some respects. That is, like the memory elements, high GMR values are desirable, as is a relatively low coercivity for the low coercivity layers. However, the coercivity of the high coercivity layers can be significantly larger than that which would be acceptable for the corresponding layers of the memory elements. In addition, it is desirable that the GMR values and coercivities of the layers of GMR resistors 108 be relatively high to ensure stability.

A simplified schematic of a transpinnor-based selection matrix is shown in FIG. 17. FIG. 17(a) shows a word line selection matrix 1700 the design for which, it will be understood, may also be used as a sense-digit line selection matrix. It will also be understood that although the embodiment shown selects from among 256 word lines, many variations of the size of the selection matrix remain within the scope of the invention.

At each intersection of a power current line 1702 and a transpinnor selection line 1704 is a transpinnor 1706 which delivers current to a selected word (or sense-digit) line 1708. A simplified representation of a transpinnor 1706 is shown in FIG. 17(b). The input selection line 1704 is shown coupled to the individual GMR resistive elements via a plurality of coils in FIG. 17(b) for didactic reasons. It will be understood, however, that the input selection line is fabricated as a stripline in integrated circuit embodiments. At the output of each transpinnor 1706 is one of 256 word (or sense-digit) lines 1708. According to a specific embodiment, the configuration of selection matrix 1700 is advantageous in that power need only be supplied to one column of transpinnors (i.e., the one corresponding to a selected word line) at one time. Transpinnors 1706 function as the gates of selection matrix 1700, a particular word or sense-digit line being selected in the following manner.

A power current is applied to the column of transpinnors 1706 which includes the transpinnor corresponding to the line 1708 to be selected via one of power current lines 1702. Power being applied to each resistively balanced transpinnor results in zero output. As discussed above, individual transpinnors may be balanced to achieve this zero output using the technique referred to herein as magnetoresistive trimming. Coincident with the application of the power current, a current is transmitted via the input selection line 1704 corresponding to the transpinnor 1706 to be selected. The field associated with this current unbalances the selected transpinnor by at least partially reversing the magnetization of at least one of the transpinnor's low coercivity layers, and thereby changing the resistance of the corresponding GMR element. The transpinnor imbalance results in a corresponding output current which is delivered to the memory array via the word (or sense-digit) line 1708 connected to the transpinnor output.

A Unified Memory Architecture

Most computer systems are based on the use of volatile main memory which is typically implemented using dynamic random access memory (DRAM) technology. The volatile nature of DRAM and its relatively high cost per bit of storage capacity has, in turn, led to the development of magnetic disk technology as the basis for the permanent mass storage component of computer memory systems. This hybrid architecture has some well know disadvantages which include, among other things, the relatively long access time for magnetic disks, increased operating system complexity, and the risk of data loss during power failures.

Figure 18:
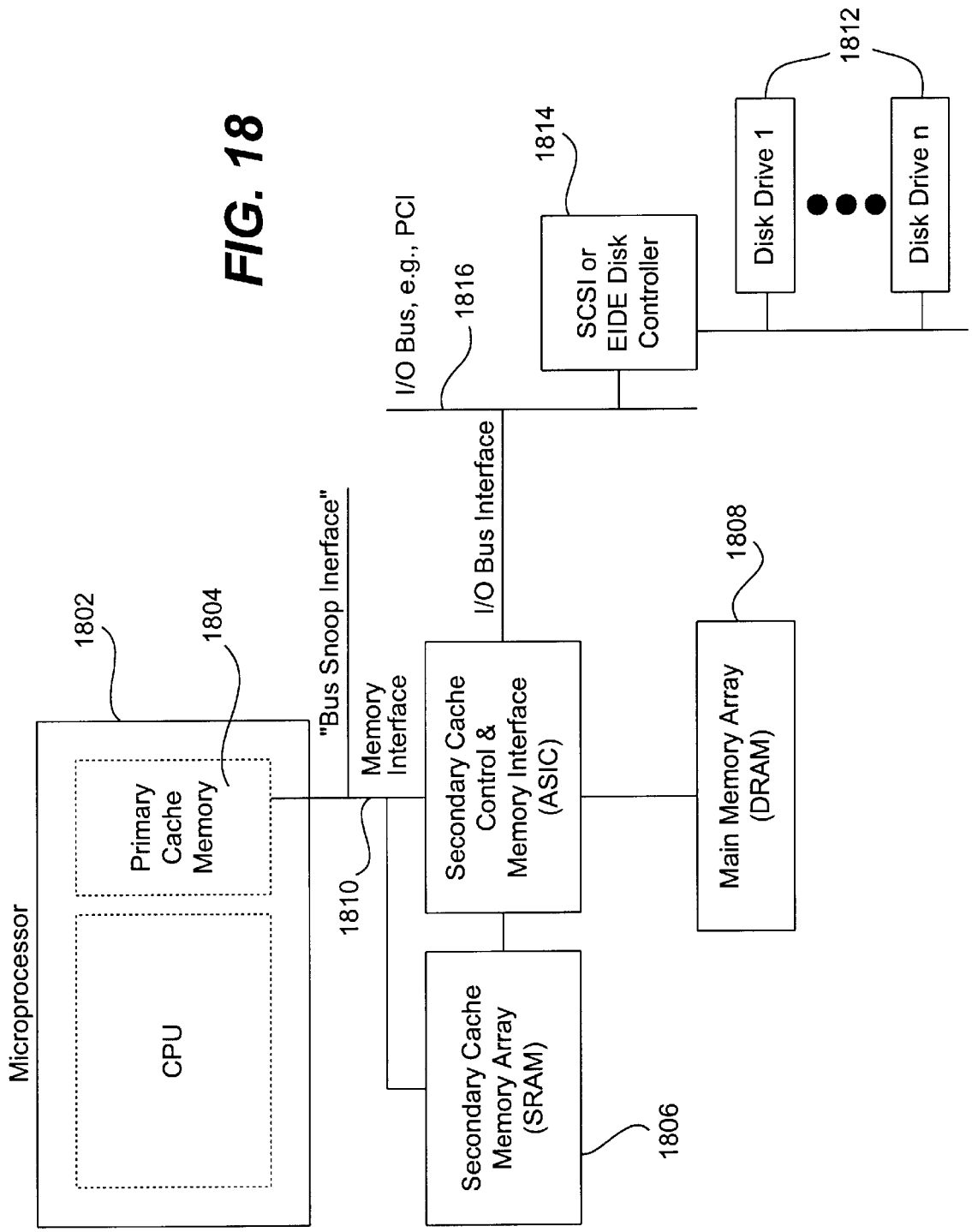
FIG. 18 shows a generalized computer memory hierarchy.

The block diagram of FIG. 18 shows a generalized computer memory hierarchy associated with a microprocessor 1802. Several types of memory technologies which serve a variety of functions are employed. A high performance primary cache 1804 is integrated with microprocessor 1802. A secondary cache 1806 is also provided. Cache memories are usually small (e.g., 256K), power hungry SRAM devices. They greatly enhance system performance by providing the microprocessor with a small block of information which may be accessed at speeds rivaling the speed of operation of the microprocessor itself. Storing a small block of data in cache memory allows most microprocessor requests (e.g., >90%) to be filled at SRAM speeds (e.g., 10 ns).

If a requested piece of information is not present in the cache, the information must be retrieved from main memory 1808. Main memory 1808 communicates with microprocessor 1802 via memory interface 1810, is typically much larger (e.g., 16M) and slower (e.g., access times of 70 ns) than cache memory, and is typically implemented in DRAM. This main memory provides microprocessor 1802 with relatively fast access to large blocks of data as well as stores and streams data to the display.

If a requested piece of information is not present in main memory, the information must be retrieved from mass storage. Such mass storage may be provided by one or more magnetic disks 1812 which are coupled to microprocessor 1802 via disk controller 1814 and I/O bus 1816 which may be, for example, an ISA, EISA, PCMCIA, PCI, or CompactPCI bus. The typical storage capacity of such magnetic disk technology is on the order of gigabytes, but the access times are orders of magnitude slower than the other levels of the memory hierarchy (e.g., 12 ms).

The present invention provides an architecture in which each of the memories outside of microprocessor 1802 may be implemented with the all-metal giant magnetoresistive memories described herein. These memories will also be referred to herein as SpinRAMs®. A comparison of the memory technologies of the present invention with the conventional memory technologies they will replace is given in Table 1. The SpinRAM technology replacement for DRAM/FLASH is also referred to as SpinRAM2 and the replacement for rotating disk storage is referred to as Spin-RAM3. SpinRAM1 is the replacement for SRAM such as that used in cache memories.

TABLE 1

Memory Technology Comparison

| Technology ▶<br><br>Parameter ▼ | SpinRAM replacement for (based on SPICE simulation) | | Conven-<br><br>tional<br>FLASH | Conven-<br><br>tional<br>DRAM |
|---|---|---|---|---|
| | DRAM/FLASH<br>(SpinRAM2) | Disk<br>(SpinRAM3) | | |
| write time | 20 ns | 50 ns | 5–10: s | 50–100 ns |
| read time | 60 ns | 1: s | 70–150 ns | 30–70 ns |
| miniaturization limit | lithography | lithography | charge leakage | charge leakage |
| cycling endurance | infinite | infinite | $10^6$ | Infinite |
| average power | low | low | medium | High |
| nonvolatility | yes | yes | yes | No |
| random access | yes | yes | no | Yes |
| intrinsic radhardness | yes | yes | no | No |

Figure 19A:
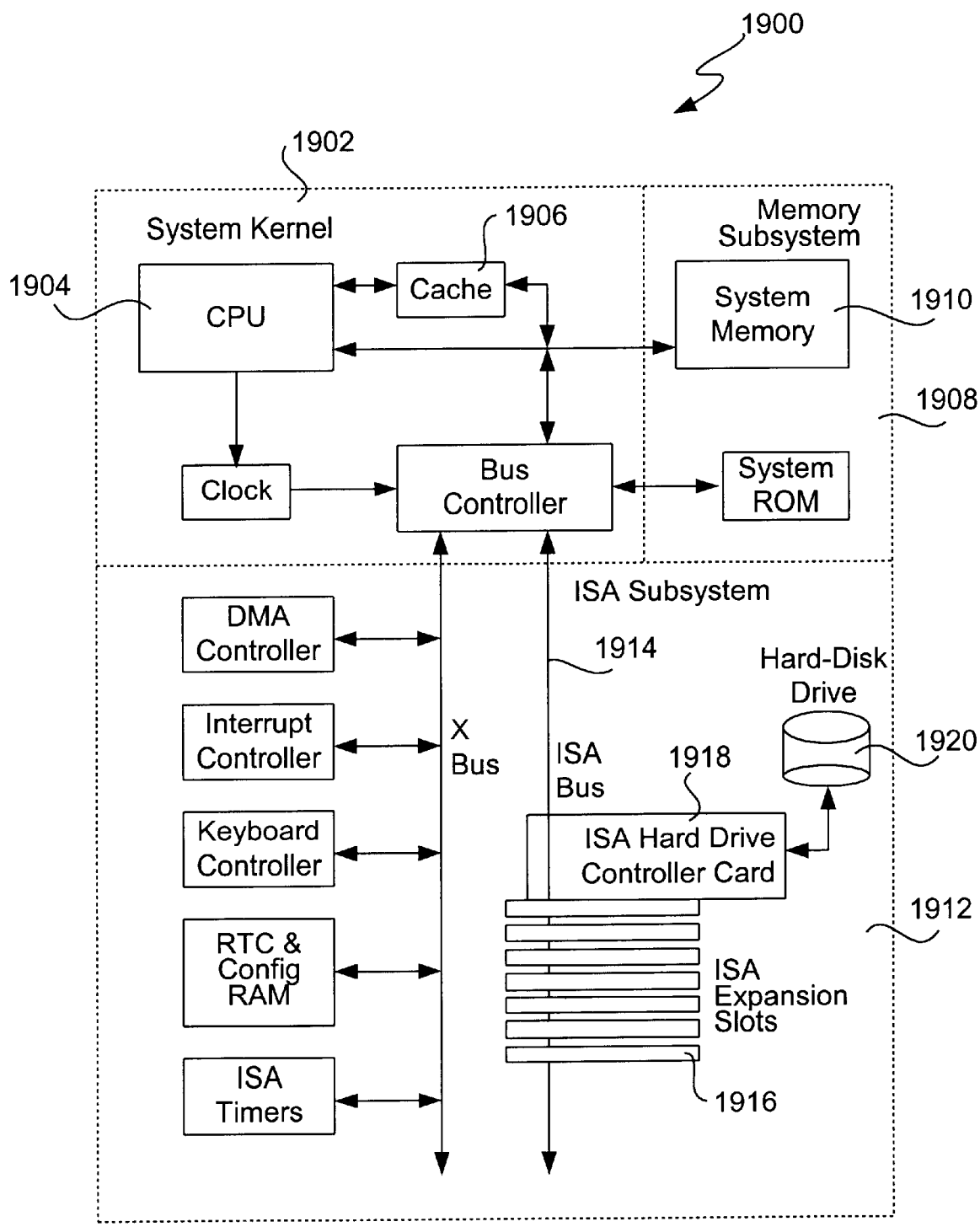
FIGS. 19(a) and 19(b) are is functional block diagrams of ISA-bus IBM compatible personal computer systems according to specific embodiments of the invention.

An example of a unified memory architecture designed according to a specific embodiment of the present invention will now be described with reference to FIGS. 19(a) and 19(b). FIG. 19(a) is a functional block diagram of an ISA-bus IBM compatible personal computer system 1900. System kernel 1902 includes CPU 1904 and cache memory 1906 which may be the CPU's primary cache or, where the CPU includes an integrated primary cache, the CPU's secondary cache. Memory subsystem 1908 includes the main system memory 1910. ISA subsystem 1912 includes an ISA bus 1914 along which are disposed ISA expansion slots 1916. At least one of the expansion slots is coupled to an ISA hard drive controller card 1918 which controls magnetic hard disk drive 1920.

Figure 19B:
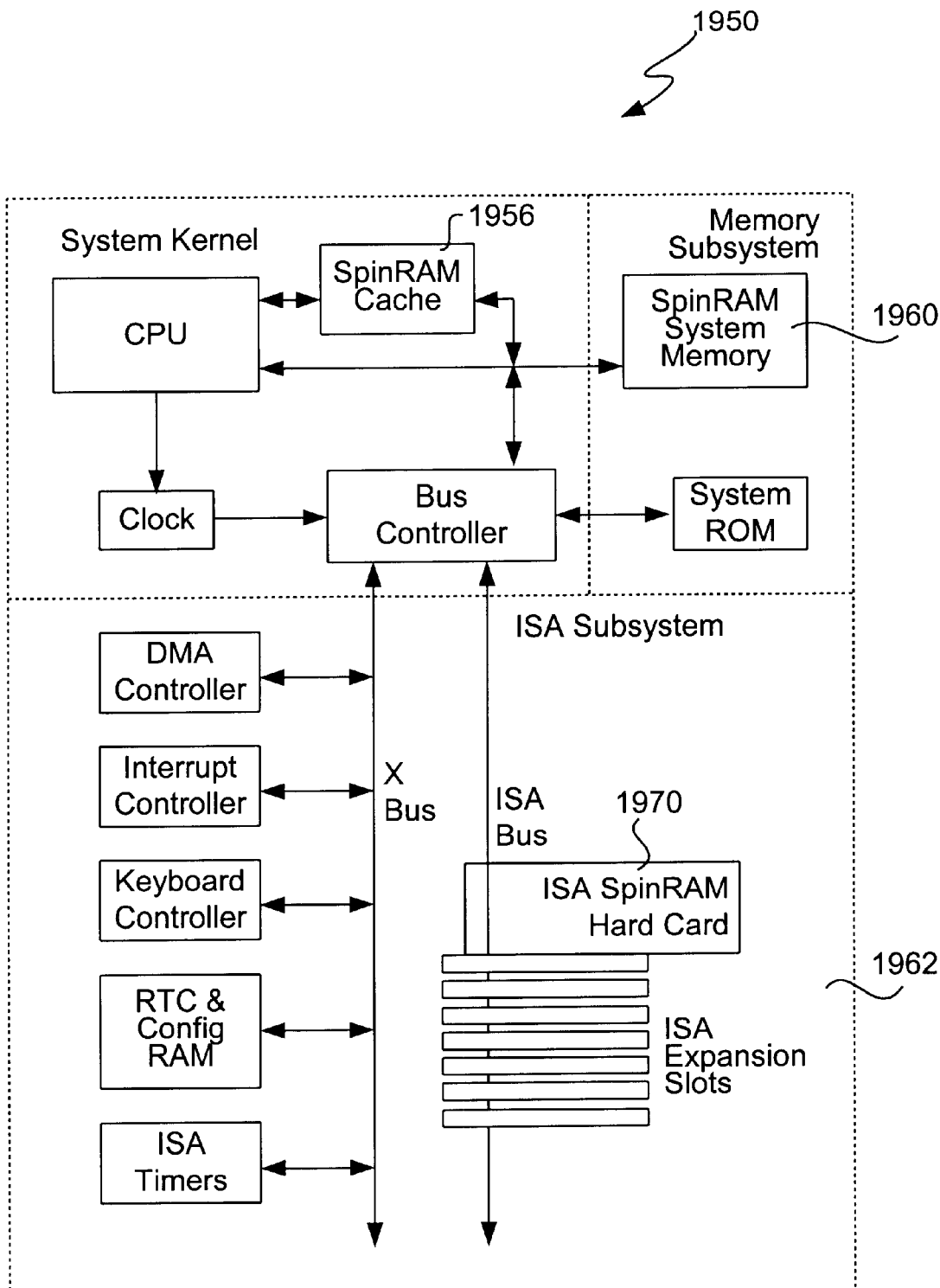

FIG. 19(b) is a functional block diagram of an ISA-bus IBM compatible computer system 1950 having a memory architecture designed according to a specific embodiment in which the cache, system, and hard disk memories of computer system 1900 have been replaced with the all-metal giant magnetoresistive memories of the present invention. It will be understood that, although an ISA system is shown in this example, the same principles may be applied to virtually any computer system, e.g., EISA, PCI, CompactPCI, without departing from the scope of the present invention.

It should also be noted that, although all three of the cache, system and hard disk memories are replaced in this example, some other subset of these memories (e.g., just the disk drive and system memory) may be replaced by the all-metal giant magnetoresistive memory technology of the present invention without departing from the invention.

With reference to ISA subsystem 1962, ISA SpinRAM hard card 1970 replaces the disk drive and controller of system 1900. The memory architecture of SpinRAM hard card 1970 may be, for example, any of the architectures and memory designs described above with reference to FIGS. 1–17. As with other solid-state memory disk replacement schemes, this embodiment eliminates the need for both the disk and its controller card. In addition to reducing size, weight, and power consumption, SpinRAM hard card 1970 drastically reduces access time and eliminates mechanical failures. And, unlike a FLASH-based hard card solution, the memory array of SpinRAM hard card 1970 may be configured to be byte-alterable, has virtually unlimited read/write cycles, and sub-microsecond read and write times.

Figure 20:
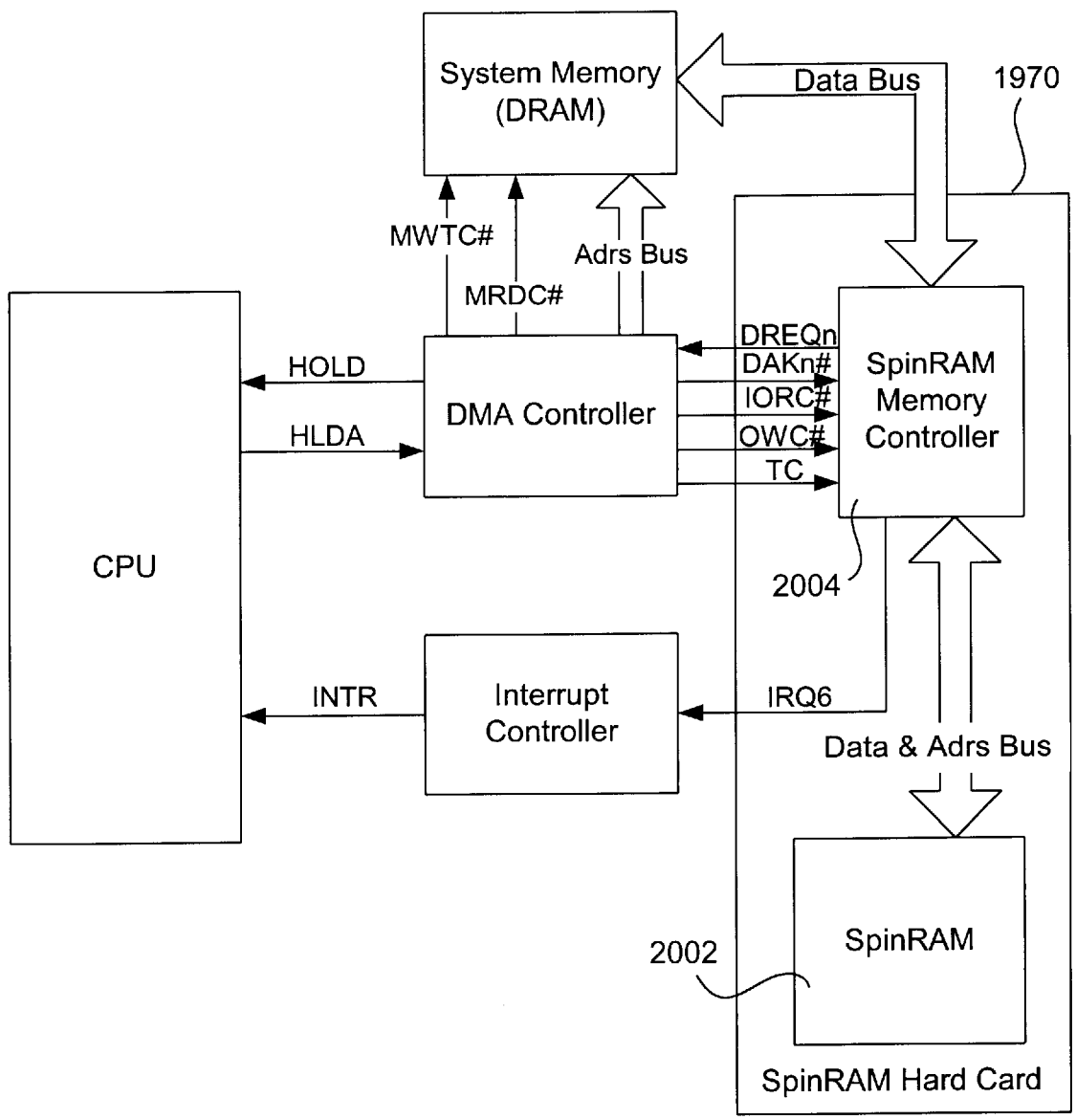
FIG. 20 is a block diagram of a specific implementation of a SpinRAM hard card in accordance with a specific embodiment of the invention.

A block diagram of a specific implementation of a Spin-RAM hard card 1970 is shown in FIG. 20. SpinRAM memory array 2002 (e.g., memory 100 of FIG. 1) is controlled by SpinRAM memory controller 2004 which, according to a specific embodiment, is located on the same hard card. In PC-bus embodiments such as the ISA embodiment of FIG. 19(b), the bus interface of controller 2004 mimics that of a standard hard disk controller. By contrast, the memory array interface of controller 2004 does not resemble the corresponding interfaces of currently available hard disk controllers. That is, for example, unlike FLASH memories and as described above, SpinRAM technology is current controlled and random access. Controller 2004 is therefore configured to facilitate access to the memory cells to SpinRAM memory array 2002 according to the techniques described above.

The desired functionality of SpinRAM controller 2004 may be implemented, for example, by modifying an existing chip set, using discrete components, or designing a custom controller ASIC. The final interface between controller 2004 and the actual memory cells of SpinRAM array 2002 comprise module interface circuits (not shown) such as, for example, selection matrices 104 and 106 of FIG. 1. According to various embodiments and as described above with reference to the all-metal memory technology of the present invention, such module interface circuits may be fabricated on the same wafer as the memory cells themselves using the same processes. According to other embodiments, such module interface circuits may be implemented in separate integrated circuits, in which case, SpinRAM memory array 2004 could be packaged as a multi-chip module.

Referring back to FIG. 19(b), SpinRAM cache memory 1956 and SpinRAM system memory 1960 replace the cache and system memories of system 1900. As with SpinRAM hard card 1970, memories 1956 and 1960 may comprise any of the architectures and memory designs described above with reference to FIGS. 1–17.

Figure 21:
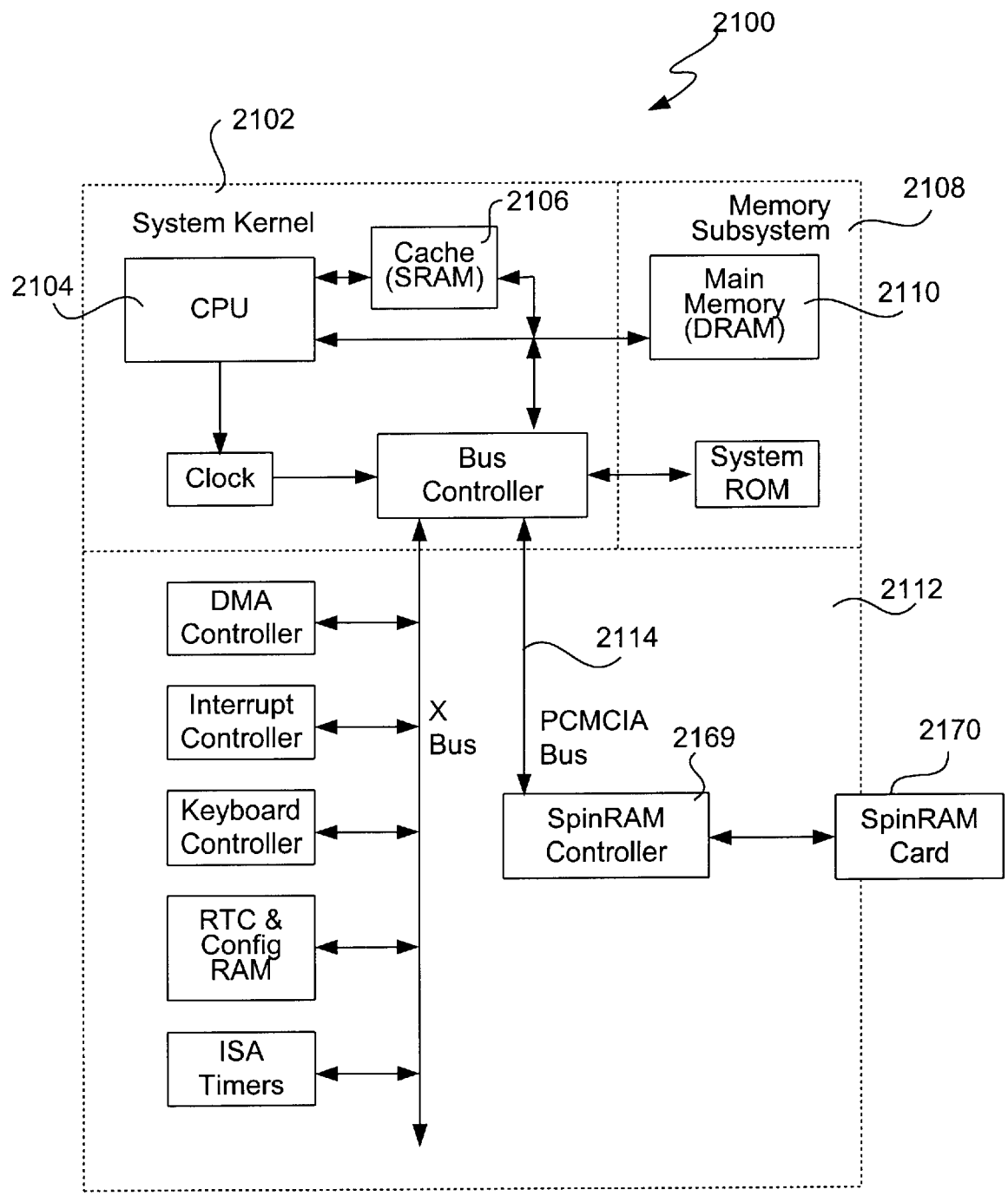
FIG. 21 is a functional block diagram of a personal computer system having a PCMCIA architecture in accordance with a specific embodiment of the invention.

FIG. 21 is a functional block diagram of a personal computer system 2100 having a PCMCIA architecture in which a conventional hard disk drive and its controller (typically coupled to PCMCIA bus 2114 have been replaced by SpinRAM controller 2169 and SpinRAM card 2170. System kernel 2102 includes CPU 2104 and cache memory 2106 which may be the CPU's primary cache or, where the CPU includes an integrated primary cache, the CPU's secondary cache. Memory subsystem 2108 includes the main system memory 2110. PCMCIA subsystem 2112 includes PCMCIA bus 2114 which is coupled to SpinRAM controller 2169.

It should be noted that the examples of specific memory architectures described above are tailored to replace an existing installed base of computer systems in which the ways in which the different types of memories are connected to the system are artifacts of the characteristics of the memory technologies themselves, and may not take full advantage of the performance capabilities of the SpinRAM technology described herein. That is, for example, although plugging a SpinRAM hard card as a replacement for a hard disk drive may represent a simple and fast integration of giant magnetoresistive memory technology into the vast installed base of IBM compatible PCs, a more fundamental memory architecture shift is contemplated which will more readily exploit the advantages of the memories of the present invention.

This may be understood with reference to the architectural constraints of the PC bus system. Because the time required for a CPU to retrieve data from a conventional hard disk is primarily a function of disk access time rather than propagation delay through the bus controller, there is little or no penalty associated with connecting the hard disk to the CPU through the controller. Of course, this is not the case for cache and system memory which are directly connected (architecturally) to the CPU. With the fast access times of the SpinRAM technology of the present invention, it is desirable to connect SpinRAM-based mass storage to the CPU in such a way to avoid the penalty imposed by conventional PC bus architectures. Such an embodiment is shown in FIG. 22.

Figure 22:
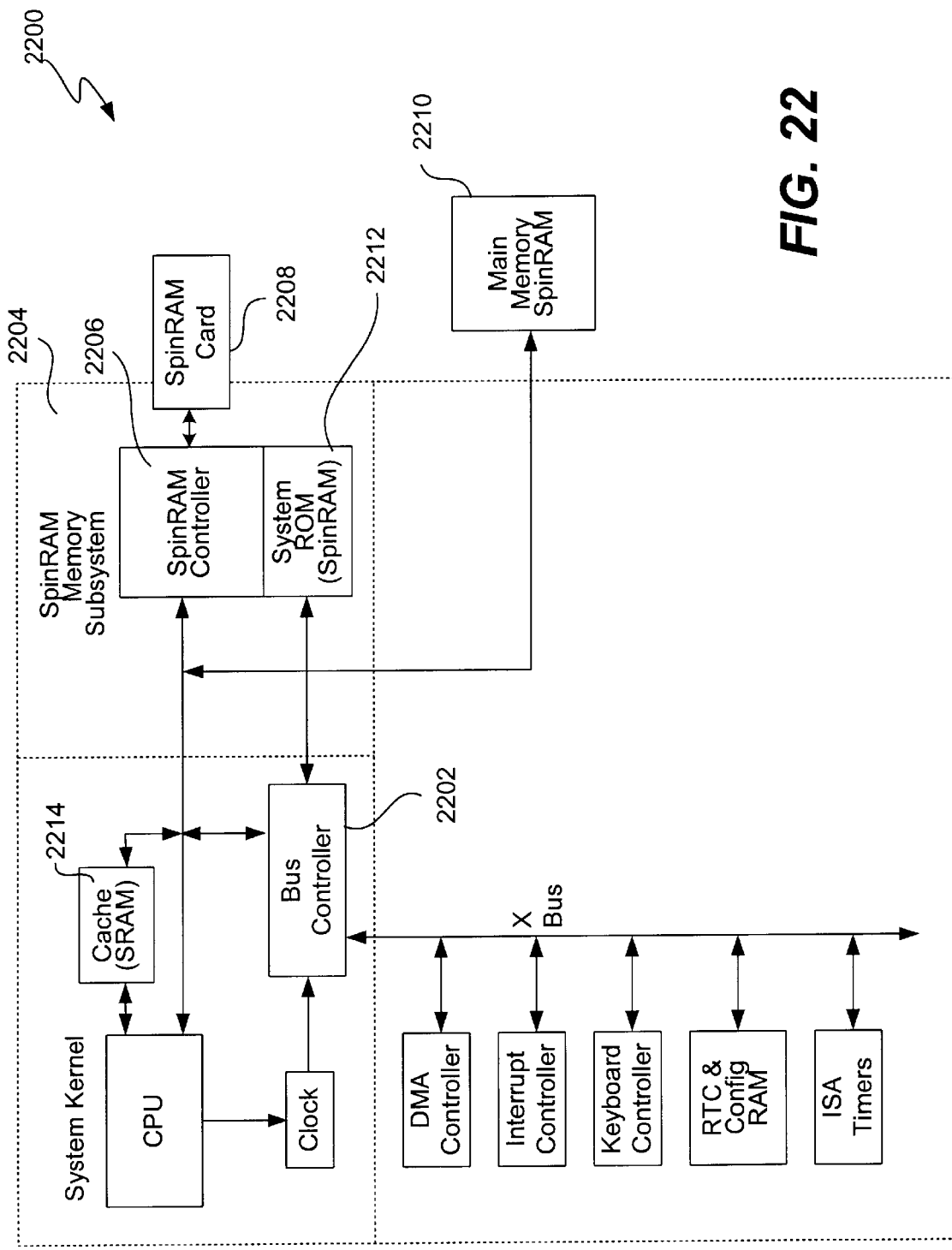
FIG. 22 is a block diagram of computer system using SpinRAM technology in accordance with a specific embodiment of the invention.

FIG. 22 is a block diagram of computer system 2200 using SpinRAM technology for system memory, system ROM, and mass storage. According to this embodiment, the architecture of computer system 2200 is designed with the capabilities of giant magnetoresistive memory technology in mind, e.g., access to mass storage via bus controller 2202 and a PC bus is eliminated. A SpinRAM memory subsystem 2204 comprises SpinRAM controller 2206 to which SpinRAM card 2208 connects. SpinRAM card 2208 may, for example, be implemented as discussed above with reference to SpinRAM card 1970. Main memory 2210 is also part of memory subsystem 2204 and comprises a SpinRAM array.

System ROM 2212 is also implemented as a giant magnetoresistive SpinRAM array. System ROM 2212 may be used, for example, to store a PC's BIOS code or user applications for a palm top device. Using the byte alterable SpinRAM of the present invention for system ROM allows the capability of updating what is typically hard coded information in many of today's computer systems. According to another embodiment, cache memory 2214 may also be implemented using the SpinRAM technology of the present invention.

It will be understood that SpinRAM memory subsystem 2204 may be configured in a variety of ways and remain within the scope of the invention. That is, subsystem 2204 may comprise different subsets of memories 2208, 2210, 2212 and 2214. In addition, different subsets of these memories may be integrated in the same device or configured as separate modules.

While the invention has been particularly shown and described with reference to specific embodiments thereof, it will be understood by those skilled in the art that changes in the form and details of the disclosed embodiments may be made without departing from the spirit or scope of the invention. For example, specific embodiments have been described herein with reference to a selection matrix implemented using single input transpinnors (e.g., see FIG. 17). It will be understood, however, that a two input transpinnor such as transpinnor 1302 of FIG. 13 may also be used to implement such a selection matrix. That is, two line selection striplines could supply magnetic fields to the two-input transpinnors in the matrix array with a separate power current input.

In addition, it will be understood that the number of memory access lines required to access information in the individual memory cells in a memory array designed according to the invention will vary in accordance with the structure of the memory cells and the number of bits stored in each. The number and types of access lines for a given memory cell structure may be determined by one of skill in the art of memory technology from, for example, the descriptions of various GMR memory cells herein.

Furthermore, although an example of a unified memory architecture has been described herein in the context of specific architecture types, it will be understood that a wide variety of memory architectures for computers and other systems are within the scope of the invention. That is, any memory architecture in which at least one of the memory types e..g., system memory, mass storage) is implemented using the giant magnetoresistive memory technology of the present invention falls within this scope.

As discussed above, in one such architecture a rotating disk is physically but not logically replaced with a SpinRAM array. That is, a memory controller is configured such that the rest of the system operates as if it is connected to a rotating disk, but the controller interacts with the SpinRAM array according to the present invention. Such an architecture eliminates the disadvantages of rotating disk memories (e.g., long access times, susceptibility to environmental conditions) without the need for extensive retrofitting or redesign of installed computer base.

Another contemplated architecture involves the partial replacement of system memory with the SpinRAM technology of the present invention. The SpinRAM portion of the system memory could, for example, be used to store data that must be preserved in the event of a power failure. According to a specific embodiment, the SpinRAM portion of the system memory store a small RAM file system which provides very fast access to a subset of the system's overall file stores.

Of course full replacement of system memory with SpinRAM technology is contemplated as well. This would allow expansion of the use of system memory to include data which must be maintained through power loss and system reboots. Such a system could recover much faster than conventional systems after a power down has occurred. All that would need to be done is the normal processor power-up diagnostics and the restoration of the internal machine state. No time would be wasted reloading information from mass storage to system memory.

Another contemplated architecture replaces both system DRAM and magnetic disk storage with SpinRAM technology. The replacement of both of these memories makes possible the unified memory architecture in which most or all of a computer system's memory is implemented using a single technology, i.e., SpinRAM. Further variations of such an architecture include the replacement of other memories with SpinRAM technology including, for example, cache memory and system ROM.

Figure 23:
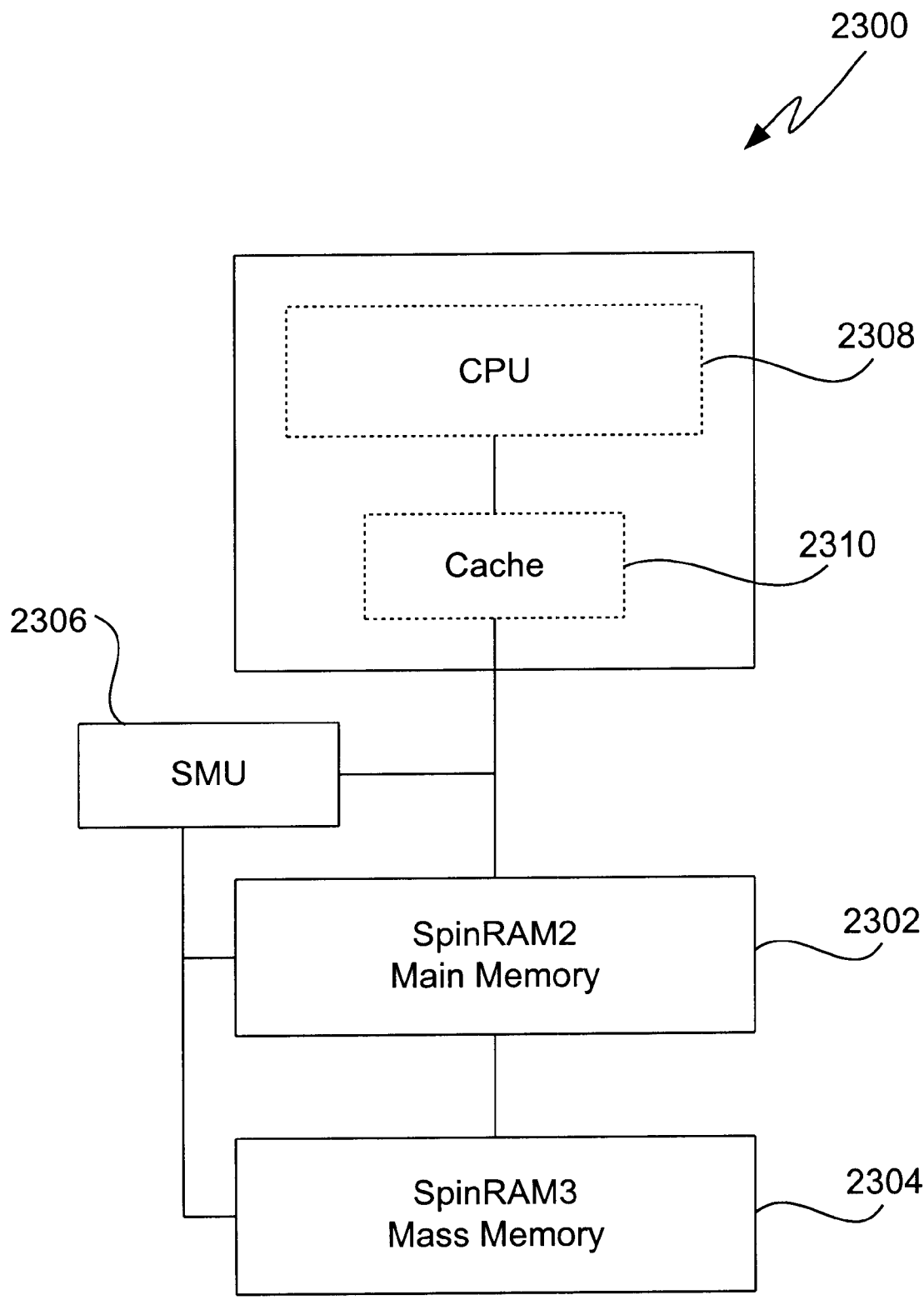
FIG. 23 is a simplified block diagram of a generalized computer system based on SpinRAM technology in accordance with a specific embodiment of the invention.

A simplified block diagram of a generalized computer system based on the SpinRAM technology of the present invention is shown in FIG. 23. The design of system 2300 is based on a two-tier architecture incorporating at least SpinRAM2 (2302) and SpinRAM3 (2304), i.e., SpinRAM replacements for DRAM and rotating disk, respectively. The main memory pool is based on SpinRAM2 (RAM speed memory), and secondary file storage on SpinRAM3 (disk density). A SpinRAM Management Unit (SMU) 2306 handles transfers between memories 2302 and 2304 and CPU 2308, providing much the same functionality as a conventional cache management unit in a computer system employing the cache memory paradigm. A cache memory 2310 may be provided close to CPU 2308 and may comprise SpinRAM1 technology. An level one cache memory (not shown) may be provided integrated with CPU 2308.

It should be noted that the present invention allows the cache paradigm to be carried throughout system 2300 regardless of the number of SpinRAM levels. Thus, for example, CPU 2308 receives data from its level one cache. The level one cache receives data from the level two cache (e.g., cache 2310). The level two cache receives data from main memory 2302. Main memory 2302 acts as a level three cache in concert with SMU 2306. Finally, main memory 2302 receives data from mass storage memory 2304 which acts as a fourth level cache.

In view of the foregoing and the myriad variations of contemplated embodiments, the scope of the invention should be determined with reference to the appended claims.

What is claimed is:

1. A memory device comprising memory cells, access lines, and support electronics for facilitating access to information stored in the memory cells via the access lines, both the memory cells and the support electronics comprising multi-layer thin film structures exhibiting giant magnetoresistance.

2. The memory device of claim 1 wherein each of the memory cells comprises:
    a plurality of magnetic layers, at least one of the magnetic layers being for magnetically storing one bit of information;
    a plurality of the access lines integrated with the plurality of magnetic layers and configured such that the bit of information may be accessed using selected ones of the plurality of access lines and the giant magnetoresistive effect; and
    at least one keeper layer;
    wherein the magnetic layers, the access lines, and the at least one keeper layer form a substantially closed flux structure.

3. The memory device of claim 2 wherein some of the plurality of magnetic layers comprise cobalt.

4. The memory device of claim 2 wherein some of the plurality of magnetic layers comprises permalloy.

5. The memory device of claim 2 wherein some of the plurality of access lines comprise copper.

6. The memory device of claim 2 wherein some of the plurality of access lines comprise multi-layer lines.

7. The memory device of claim 2 wherein each of the memory cells comprises a dibit memory cell, the plurality of magnetic layers comprising two storage layers.

8. The memory device of claim 7 wherein the two storage layers and the plurality of access lines are configured to read the bits of information destructively.

9. The memory device of claim 7 wherein the two storage layers and the plurality of access lines are configured to read the bits of information nondestructively.

10. The memory device of claim 2 wherein each of the memory cells comprises a three bit memory cell, the plurality of magnetic layers comprising three storage layers.

11. The memory device of claim 10 wherein the three storage layers and the plurality of access lines are configured to read the bits of information destructively.

12. The memory device of claim 10 wherein the three storage layers and the plurality of access lines are configured to read the bits of information nondestructively.

13. The memory device of claim 2 wherein each of the memory cells comprises a four bit memory cell, the plurality of magnetic layers comprising four storage layers.

14. The memory device of claim 13 wherein the four storage layers and the plurality of access lines are configured to read the bits of information destructively.

15. The memory device of claim 13 wherein the four storage layers and the plurality of access lines are configured to read the bits of information nondestructively.

16. The memory device of claim 2 wherein each of the memory cells comprises a single bit memory cell, the plurality of magnetic layers comprising one storage layer.

17. The memory device of claim 16 wherein the storage layer and the plurality of access lines are configured to read the bit of information destructively.

18. The memory device of claim 16 wherein the storage layer and the plurality of access lines are configured to read the bit of information nondestructively.

19. The memory device of claim 1 wherein all of the memory cells and support electronics comprise the multi-layer thin film structures exhibiting giant magnetoresistance, the memory device therefore comprising an all metal memory device.

20. The memory device of claim 1 wherein only selected ones of the memory cells and support electronics comprise the multi-layer thin film structures exhibiting giant magnetoresistance.

21. The memory device of claim 1 wherein the support electronics comprise a plurality of access line selection matrices for selecting selected ones of the plurality of access lines.

22. The memory device of claim 21 wherein each selection matrix comprises an array of transpinnors, each transpinnor comprising a network of the multi-layer thin film structures, and at least one of the access lines inductively coupled to at least one of the thin film structures for applying at least one magnetic field thereto, each transpinnor generating an output when the network is resistively unbalanced.

23. The memory device of claim 1 wherein the support electronics comprise a plurality of transpinnors, each transpinnor comprising a network of the multi-layer thin film structures, and at least one conductor inductively coupled to at least one of its thin film structures for applying at least one magnetic field thereto, each transpinnor generating an output when the network is resistively unbalanced.

24. The memory device of claim 23 wherein selected ones of the transpinnors are configured as amplifiers for amplifying signals on selected ones of the access lines.

25. The memory device of claim 23 wherein selected ones of the transpinnors are configured as differential amplifiers for resistively balancing pairs of the access lines.

26. The memory device of claim 23 wherein selected subsets of the transpinnors are configured as a selection matrix for facilitating selection of specific ones of the access lines.

27. The memory device of claim 1 wherein the support electronics comprise a plurality of configurable resistive elements.

28. The memory device of claim 27 wherein each configurable resistive element comprises at least one high coercivity layer and at least one low coercivity layer, a resistance value associated with each configurable resistive element being configurable by at least partially switching a first magnetization vector associated with the high coercivity layer.

29. The memory device of claim 2 further comprising a non-magnetic conductor layer, wherein the plurality of magnetic layers comprises two magnetic layers for storing two bits of information, the two magnetic layers being separated by and in electrical contact with the non-magnetic conductor layer, and wherein the plurality of access lines comprises a first access line from which the two magnetic layers are electrically insulated.

30. The memory device of claim 29 wherein the at least one keeper layer is disposed outside of the two magnetic layers and the first access line.

31. The memory device of claim 2 further comprising a plurality of non-magnetic conductor layers, wherein the plurality of magnetic layers are configured in two structures, each structure comprising two of the magnetic layers separated by and in electrical contact with one of the non-magnetic conductor layers, and wherein the plurality of access lines comprises a first access line disposed between the two structures and electrically insulated therefrom.

32. The memory device of claim 31 wherein the at least one keeper layer is disposed outside of the two structures.

33. The memory device of claim 31 further comprising an additional keeper layer in the middle of the insulated non-magnetic conductor layer.

34. The memory device of claim 2 wherein the plurality of magnetic layers comprises four magnetic layers and wherein the memory device further comprises three non-magnetic conductor layers separating and in electrical contact with the four magnetic layers, the memory device further comprising a fourth non-magnetic conductor layer electrically insulated from the magnetic layers, wherein the at least one keeper layer is disposed outside the magnetic layers and the non-magnetic conductor layers, and wherein the memory device is operable in a first mode of operation for storage and nondestructive readout of two bits of information, and in a second mode of operation for storage and destructive readout of four bits of information.

35. The memory device of claim 34 further comprising a fifth non-magnetic conductor layer disposed adjacent one of the at least one keeper layer and operable to pass current substantially perpendicular to the three non-magnetic conductor layers.

36. A memory device comprising memory cells, access lines, and support electronics for facilitating access to information stored in the memory cells using the access lines, both the memory cells and the support electronics comprising multi-layer thin film structures exhibiting giant magnetoresistance, each of the memory cells comprising a plurality of magnetic layers at least one which is for magnetically storing one bit of information, wherein a plurality of the access lines are integrated with the plurality of magnetic layers in each memory cell and configured such that the bit of information may be accessed using selected ones of the plurality of access lines and the giant magnetoresistive effect, and wherein the support electronics comprise a plurality of transpinnors, each transpinnor comprising a network of the multi-layer thin film structures, and at least one conductor inductively coupled to at least one of its thin film structures for applying at least one magnetic field thereto, each transpinnor generating an output when the network is resistively unbalanced.

37. A method for making a solid-state memory device comprising:
   forming memory cells comprising first multi-layer thin film structures exhibiting giant magnetoresistance;
   forming access lines which are integrated with the memory cells; and
   forming support electronics for facilitating access to information stored in the memory cells via the access lines, the support electronics comprising second multi-layer thin film structures exhibiting giant magnetoresistance.

38. A method for making a solid-state memory device comprising memory cells, access lines, and support electronics, the memory comprising:
   forming the memory cells, each of the memory cells comprising a plurality of magnetic layers at least one which is for magnetically storing one bit of information, wherein a plurality of the access lines are integrated with the plurality of magnetic layers in each memory cell and configured such that the bit of information may be accessed using selected ones of the plurality of access lines and the giant magnetoresistive effect; and
   forming the support electronics including a plurality of transpinnors, each transpinnor comprising a network of multi-layer thin film structures exhibiting giant magnetoresistance, and at least one conductor inductively coupled to at least one of its thin film structures for applying at least one magnetic field thereto, each transpinnor generating an output when its network is resistively unbalanced.

39. A memory architecture associated with a processor, the memory architecture comprising system memory for facilitating execution of computer program instructions by the processor, and mass memory for storing information which may be accessed by the processor, the system memory and the mass memory comprising first and second random access memories, respectively, which include first and second arrays of memory cells, respectively, each memory cell in the first and second arrays comprising a multi-layer thin film structure exhibiting giant magnetoresistance.

40. The memory architecture of claim 39 further comprising cache memory for facilitating execution of computer program instructions by the processor, the cache memory comprising a third random access memory which includes a third array of memory cells, the memory cells in the third array comprising additional multi-layer thin film structures exhibiting giant magnetoresistance.

41. The memory architecture of claim 39 further comprising read-only memory for storing computer program instructions for execution by the processor, the read-only memory comprising a third random access memory which includes a third array of memory cells, the memory cells in the third array comprising additional multi-layer thin film structures exhibiting giant magnetoresistance.

42. The memory architecture of claim 39 wherein the processor is part of an ISA system having an ISA bus, the mass memory being for coupling to the ISA bus.

43. The memory architecture of claim 39 wherein the processor is part of an EISA system having an EISA bus, the mass memory being for coupling to the EISA bus.

44. The memory architecture of claim 39 wherein the processor is part of a PCMCIA system having a PCMCIA bus, the mass memory being for coupling to the PCMCIA bus.

45. The memory architecture of claim 39 wherein the processor is part of a system kernel, the system memory being part of a first memory subsystem for coupling to the system kernel, and the mass memory being part of a second memory subsystem for coupling to the system kernel.

46. The memory architecture of claim 39 wherein the processor is part of a system kernel, the system memory and the mass memory both being part of a single memory subsystem for coupling to the system kernel.

47. The memory architecture of claim 39 wherein at least one of the system memory and mass memory are contained in a plug-in module which may be plugged into a processing system of which the processor is a part.

48. The memory architecture of claim 47 the plug-in module comprises a hard card for connecting to an ISA bus associated with the processing system.

49. The memory architecture of claim 47 the plug-in module comprises a hard card for connecting to an EISA bus associated with the processing system.

50. The memory architecture of claim 47 the plug-in module comprises a PCMCIA card for connecting to PCMCIA bus associated with the processing system.

51. The memory architecture of claim 47 wherein both the system memory and the mass memory are contained in the plug-in module.

52. The memory architecture of claim 47 wherein only one of the system memory and the mass memory are contained in the plug-in module.

53. The memory architecture of claim 39 wherein each of the memory cells comprises:
a plurality of magnetic layers, at least one of the magnetic layers being for magnetically storing a bit of information;
a plurality of access lines integrated with the plurality of magnetic layers and configured such that the bit of information may be accessed using selected ones of the plurality of access lines and the giant magnetoresistive effect; and
at least one keeper layer;
wherein the magnetic layers, the access lines, and the at least one keeper layer form a substantially closed flux structure.

54. The memory architecture of claim 53 wherein some of the plurality of magnetic layers comprise cobalt.

55. The memory architecture of claim 53 wherein some of the plurality of magnetic layers comprises permalloy.

56. The memory architecture of claim 53 wherein some of the plurality of access lines comprise copper.

57. The memory architecture of claim 53 wherein some of the plurality of access lines comprise multi-layer lines.

58. The memory architecture of claim 53 wherein each of the memory cells comprises a dibit memory cell, the plurality of magnetic layers comprising two storage layers.

59. The memory architecture of claim 58 wherein the two storage layers and the plurality of access lines are configured to read the bits of information destructively.

60. The memory architecture of claim 58 wherein the two storage layers and the plurality of access lines are configured to read the bits of information nondestructively.

61. The memory architecture of claim 53 wherein each of the memory cells comprises a three bit memory cell, the plurality of magnetic layers comprising three storage layers.

62. The memory architecture of claim 61 wherein the three storage layers and the plurality of access lines are configured to read the bits of information destructively.

63. The memory architecture of claim 61 wherein the three storage layers and the plurality of access lines are configured to read the bits of information nondestructively.

64. The memory architecture of claim 53 wherein each of the memory cells comprises a four bit memory cell, the plurality of magnetic layers comprising four storage layers.

65. The memory architecture of claim 64 wherein the four storage layers and the plurality of access lines are configured to read the bits of information destructively.

66. The memory architecture of claim 64 wherein the four storage layers and the plurality of access lines are configured to read the bits of information nondestructively.

67. The memory architecture of claim 53 wherein each of the memory cells comprises a single bit memory cell, the plurality of magnetic layers comprising one storage layer.

68. The memory architecture of claim 67 wherein the storage layer and the plurality of access lines are configured to read the bit of information destructively.

69. The memory architecture of claim 67 wherein the storage layer and the plurality of access lines are configured to read the bit of information nondestructively.

70. The memory architecture of claim 39 wherein each of the first and second random access memories further comprises support electronics which comprise multi-layer thin film structures exhibiting giant magnetoresistance.

71. The memory architecture of claim 20 wherein the support electronics comprise a plurality of access line selection matrices for selecting access lines associated with the memory cells.

72. The memory architecture of claim 71 wherein each selection matrix comprises an array of transpinnors, each transpinnor comprising a network of the multi-layer thin film structures, and at least one access line inductively coupled to at least one of the thin film structures for applying at least one magnetic field thereto, each transpinnor generating an output when the network is resistively unbalanced.

73. The memory architecture of claim 70 wherein the support electronics comprise a plurality of transpinnors, each transpinnor comprising a network of the multi-layer thin film structures, and at least one conductor inductively coupled to at least one of its thin film structures for applying at least one magnetic field thereto, each transpinnor generating an output when the network is resistively unbalanced.

74. The memory architecture of claim 73 wherein selected ones of the transpinnors are configured as amplifiers for amplifying signals on access lines associated with the first and second arrays.

75. The memory architecture of claim 73 wherein selected ones of the transpinnors are configured as differential amplifiers for resistively balancing pairs of access lines associated with the first and second arrays.

76. The memory architecture of claim 73 wherein selected subsets of the transpinnors are configured as a selection matrix for facilitating s electio n of access lines associated with the first and second arrays.

77. The memory architecture of claim 70 wherein the support electronics comprise a plurality of configurable resistive elements.

78. The memory architecture of claim 77 wherein each configurable resistive element comprises at least one high coercivity layer and at least one low coercivity layer, a resistance value associated with each configurable resistive element being configurable by at least partially switching a first magnetization vector associated with the high coercivity layer.

79. A memory device comprising first and second sense lines, each sense line comprising four magnetic layers separated by and in electrical contact with three non-magnetic conductor layers, the memory device also comprising a fourth non-magnetic conductor layer between the first and second sense lines and electrically insulated therefrom, the memory device also comprising a fifth non-magnetic conductor layer above the first and second sense lines and electrically insulated therefrom, the memory device also comprising at least one keeper layer disposed outside the first and second sense lines and the fourth and fifth non-magnetic conductor layers.

80. The memory device of claim 79 wherein the memory device is operable to effect storage and nondestructive readout of four bits of information.

81. The memory device of claim 79 further comprising an additional keeper layer in the center of the fourth non-magnetic conductor layer, wherein the memory device is operable to effect storage and destructive readout of eight bits of information.

82. A method of reading information in a structure comprising first and second magnetic layers separated by and in electrical contact with a non-magnetic conductor layer, the method comprising measuring a resistance of the structure, applying via the conductor layer a first current sufficient to switch a first magnetization associated with the first magnetic layer in a first direction and insufficient to switch a second magnetization associated with the second magnetic layer, measuring the resistance a second time, applying via the conductor layer a second current sufficient to switch the first magnetic magnetization in a second direction and insufficient to switch the second magnetization, and measuring the resistance of the structure a third time.

* * * * *